(12) United States Patent
Lee et al.

(10) Patent No.: US 12,058,890 B2
(45) Date of Patent: Aug. 6, 2024

(54) DISPLAY PANEL AND DISPLAY APPARATUS INCLUDING THE SAME

(71) Applicant: SAMSUNG DISPLAY CO., LTD., Yongin-si (KR)

(72) Inventors: Yujin Lee, Yongin-si (KR); Sunhwa Lee, Yongin-si (KR); Heejean Park, Yongin-si (KR); Jaeyong Jang, Yongin-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 420 days.

(21) Appl. No.: 17/546,560

(22) Filed: Dec. 9, 2021

(65) Prior Publication Data

US 2022/0320189 A1 Oct. 6, 2022

(30) Foreign Application Priority Data

Apr. 2, 2021 (KR) ........................ 10-2021-0043498

(51) Int. Cl.
*H10K 59/121* (2023.01)
*H10K 59/131* (2023.01)

(52) U.S. Cl.
CPC ......... *H10K 59/121* (2023.02); *H10K 59/131* (2023.02)

(58) Field of Classification Search
CPC .. H10K 59/121; H10K 59/123; H10K 59/131; H10K 59/353; H10K 59/87; H10K 59/873
See application file for complete search history.

(56) References Cited

U.S. PATENT DOCUMENTS

| | | | |
|---|---|---|---|
| 7,075,601 B2 | 7/2006 | Hong et al. | |
| 10,546,900 B2 | 1/2020 | Jeon et al. | |
| 2002/0149684 A1* | 10/2002 | Leveau-Mollier | H04N 25/63 348/E5.081 |
| 2020/0170126 A1* | 5/2020 | Ahn | G06F 1/1637 |
| 2021/0020111 A1* | 1/2021 | Yamada | H10K 59/131 |
| 2021/0376038 A1* | 12/2021 | Won | H10K 77/111 |

(Continued)

FOREIGN PATENT DOCUMENTS

| | | |
|---|---|---|
| KR | 100864488 B1 | 10/2008 |
| KR | 1020150029362 A | 3/2015 |

(Continued)

*Primary Examiner* — Dmitriy Bolotin
(74) *Attorney, Agent, or Firm* — CANTOR COLBURN LLP

(57) ABSTRACT

A display panel includes a substrate including a corner display area including a strip portion between cut portions; and corner pixels in the strip portion and corner pixel circuits which drives the corner pixels, wherein each of the corner pixels includes a first sub-pixel, a second sub-pixel, and a third sub-pixel, and each of the corner pixel circuits includes a first pixel circuit which drives the first sub-pixel, a second pixel circuit which drives the second sub-pixel, and a third pixel circuit which drives the third sub-pixel, and the first pixel circuit, the second pixel circuit, and the third pixel circuit included in an n-th corner pixel circuit in a first direction that is a lengthwise direction of the strip portion are arranged differently from the first pixel circuit, the second pixel circuit, and the third pixel circuit in an (n+1)-th corner pixel circuit.

20 Claims, 22 Drawing Sheets

(56) References Cited

U.S. PATENT DOCUMENTS

| | | | | |
|---|---|---|---|---|
| 2022/0302243 A1* | 9/2022 | Jang | ................... | H10K 59/123 |
| 2022/0320189 A1* | 10/2022 | Lee | ................... | H10K 59/121 |
| 2023/0225163 A1* | 7/2023 | Kim | ................... | H10K 59/121 |
| | | | | 257/40 |
| 2023/0225164 A1* | 7/2023 | Seo | ................... | H10K 59/131 |
| | | | | 257/72 |
| 2024/0040868 A1* | 2/2024 | Cho | ................... | H10K 59/121 |

FOREIGN PATENT DOCUMENTS

| | | |
|---|---|---|
| KR | 1020180100012 A | 9/2018 |
| KR | 1020200049826 A | 5/2020 |

\* cited by examiner

DISPLAY PANEL AND DISPLAY APPARATUS INCLUDING THE SAME

This application claims to Korean Patent Application No. 10-2021-0043498, filed on Apr. 2, 2021, and all the benefits accruing therefrom priority under 35 U.S.C. § 119, the content of which in its entirety is herein incorporated by reference.

BACKGROUND

1. Field

One or more embodiments relate to a display panel and a display apparatus including the display panel, and more particularly, to a display panel having an expanded display area to display images on side and corner areas, and a display apparatus including the display panel.

2. Description of the Related Art

Display apparatuses having various shapes, e.g., curved display apparatuses, foldable display apparatuses and rollable display apparatuses, have been developed. In such display apparatuses, display areas have been enlarged and non-display areas have been reduced, and various methods have been used to design shapes of display apparatuses.

SUMMARY

One or more embodiments include a display panel having an expanded display area to display images on corner regions, and a display apparatus including the display panel.

According to an embodiment, a display panel includes a substrate including a main display area and a corner display area, where the corner display area extends from a corner of the main display area and includes a strip portion between cut portions; main pixels on the substrate in the main display area; main pixel circuits on the substrate in the main display area, where the main pixel circuits drive the main pixels; corner pixels on the substrate in the strip portion; and corner pixel circuits on the substrate in the strip portion, wherein the corner pixel circuits drive the corner pixels. In such an embodiment, each of the corner pixels includes a first sub-pixel, a second sub-pixel, and a third sub-pixel, and each of the corner pixel circuits includes a first pixel circuit which drives the first sub-pixel, a second pixel circuit which drives the second sub-pixel, and a third pixel circuit which drives the third sub-pixel, and an arrangement of the first pixel circuit, the second pixel circuit and the third pixel circuit in an n-th corner pixel circuit in a first direction, which is a lengthwise direction of the strip portion, is different from an arrangement of the first pixel circuit, the second pixel circuit and the third pixel circuit in an (n+1)-th corner pixel circuit in the first direction, where n is a natural number.

In an embodiment, the first pixel circuits and the third pixel circuits may be alternately arranged in a first column which extends in the first direction, and the second pixel circuits may be arranged in a second column which is adjacent to the first column.

In an embodiment, the first pixel circuit of the n-th corner pixel circuit may overlap the first sub-pixel, and the first pixel circuit of the (n+1)-th corner pixel circuit may overlap the third sub-pixel.

In an embodiment, an arrangement of the main pixels may be arranged differently from an arrangement of the corner pixels.

In an embodiment, the main pixels may be arranged in a Pentile pixel arrangement structure and the corner pixels may be arranged in an S-stripe structure.

In an embodiment, the corner pixel circuits may be in a center portion of the strip portion, and signal lines extending in the first direction may be at edges of the strip portion.

In an embodiment, the signal lines may transfer scan signals, and some of the signal lines may be connected to the n-th corner pixel circuit and the (n+1)-th corner pixel circuit.

In an embodiment, a corner data line, which transfers data signals to the corner pixel circuits, may overlap the corner pixel circuits and may extend in the first direction.

In an embodiment, the corner display area may include a first corner display area and a second corner display area, the strip portion may be in the first corner display area, and a scan driving circuit may be in the second corner display area.

In an embodiment, the corner pixels in the second corner display area may at least partially overlap the scan driving circuit.

According to an embodiment, a display apparatus includes: a display panel including a main display area and a corner display area, where the corner display area extends from a corner of the main display area and is curved with a preset radius of curvature; and a cover window covering the display panel, and having a shape corresponding to a shape of the display panel. In such an embodiment, the corner display area includes a strip portion between cut portions, the strip portion includes corner pixels and corner pixel circuits which drives the corner pixels, each of the corner pixels include a first sub-pixel, a second sub-pixel, and a third sub-pixel, and each of the corner pixel circuits includes a first pixel circuit which drives the first sub-pixel, a second pixel circuit which drives the second sub-pixel, and a third pixel circuit which drives the third sub-pixel, and an arrangement of the first pixel circuit, the second pixel circuit and the third pixel circuit in an n-th corner pixel circuit in a first direction, which is a lengthwise direction of the strip portion, is different from an arrangement of the first pixel circuit, the second pixel circuit and the third pixel circuit in an (n+1)-th corner pixel circuit in the first direction, where n is a natural number.

In an embodiment, the first pixel circuits and the third pixel circuits may be alternately arranged in a first column which extends in the first direction, and the second pixel circuits may be arranged in a second column which is adjacent to the first column.

In an embodiment, the first pixel circuit of the n-th corner pixel circuit may overlap the first sub-pixel, and the first pixel circuit of the (n+1)-th corner pixel circuit may overlap the third sub-pixel.

In an embodiment, the main display area may include main pixels and main pixel circuits which drives the main pixels, and an arrangement of the main pixels may be different from an arrangement of the corner pixels.

In an embodiment, the main pixels may be arranged in a Pentile pixel arrangement structure and the corner pixels may be arranged in an S-stripe structure.

In an embodiment, the corner pixel circuits may be in a center portion of the strip portion, and signal lines extending in the first direction may be at edges of the strip portion.

In an embodiment, the signal lines may transfer scan signals, and some of the signal lines may be connected to the n-th corner pixel circuit and the (n+1)-th corner pixel circuit.

In an embodiment, a corner data line, which transfers data signals to the corner pixel circuits, may overlap the corner pixel circuits and may extend in the first direction.

In an embodiment, the corner display area may include a first corner display area and a second corner display area, the strip portion may be in the first corner display area, and a scan driving circuit may be in the second corner display area.

In an embodiment, the corner pixels in the second corner display area may at least partially overlap the scan driving circuit.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
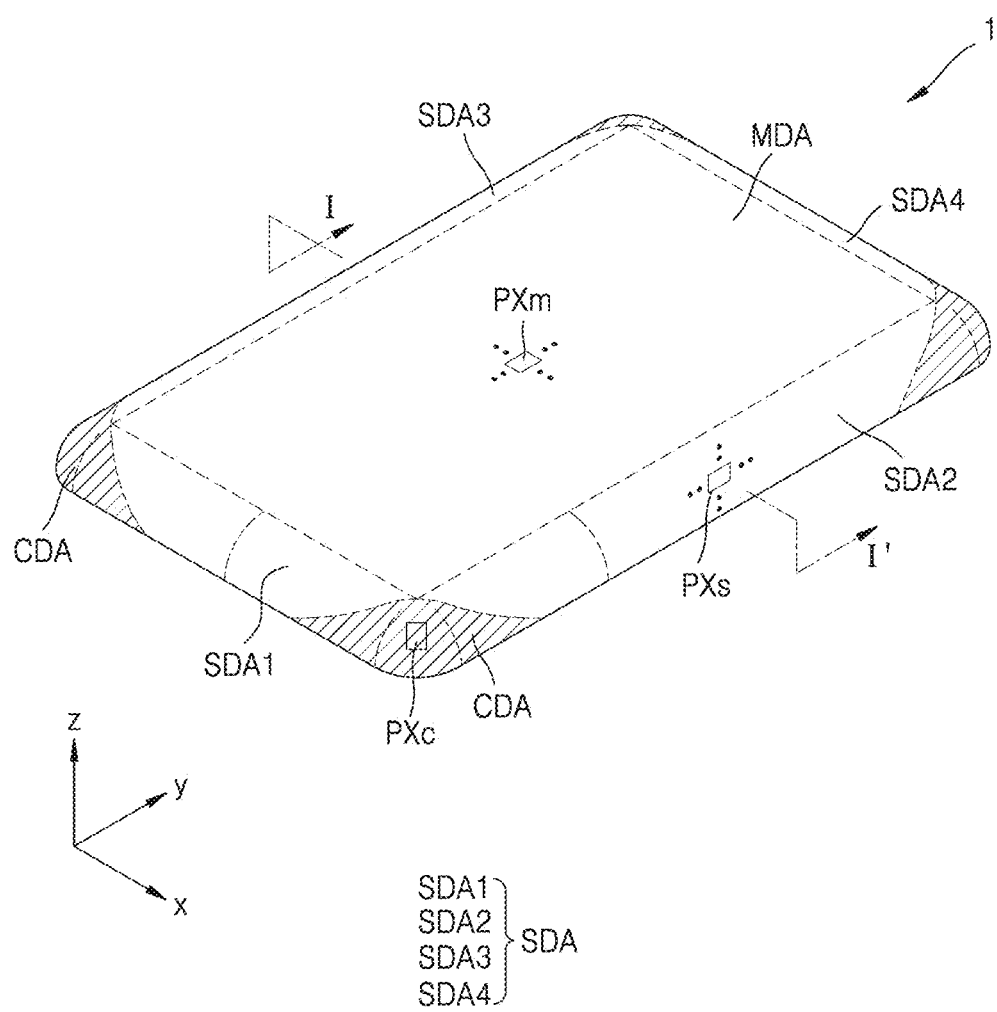
FIG. 1 is a perspective view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view of a display apparatus 1 according to an embodiment.

Referring to FIG. 1, an embodiment of the display apparatus 1 is a device for displaying a video or a still image, and may include, for example, not only portable electronic devices such as a mobile phone, a smart phone, a tablet personal computer ("PC"), a smart watch, a watch phone, a mobile communication terminal, an electronic notebook, an electronic book, a portable multimedia player ("PMP"), a navigation device, an ultra-mobile PC ("UMPC"), etc., but also various devices for displaying images such as a television, a laptop computer, a monitor, a billboard, internet of things ("IoT"), etc.

In an embodiment, as shown in FIG. 1, the display apparatus 1 may include a main display area MDA, a side display area SDA, and corner display areas CDA.

The main display area MDA is a region defined on a front surface portion of the display apparatus 1, and may be flat, not curved. The main display area MDA may have a rectangular shape including short sides in an x-direction and long sides in a y-direction. However, one or more embodiments are not limited thereto. Alternatively, the main display area MDA may have one of other various polygonal shape, rather than the rectangular shape, and may have a polygonal shape, in which a corner where a short side and a long side meet each other may be round, for example.

The side display area SDA may include a first side display area SDA1, a second side display area SDA2, a third side display area SDA3, and a fourth side display area SDA4.

The first side display area SDA1 may be a region that extends from a first side of the main display area MDA and is curved at a certain curvature. The first side display area SDA1 may extend from a lower side of the main display area MDA. The first side display area SDA1 may be arranged (or disposed) at a lower side surface of the display apparatus 1.

The second side display area SDA2 may be a region that extends from a second side of the main display area MDA and is curved at a certain curvature. The second side display area SDA2 may extend from a right side of the main display area MDA. The second side display area SDA2 may be arranged at a right side surface of the display apparatus 1.

The third side display area SDA3 may be a region that extends from a third side of the main display area MDA and is curved at a certain curvature. The third side display area SDA3 may extend from a left side of the main display area MDA. The third side display area SDA3 may be arranged at a left side surface of the display apparatus 1.

The fourth side display area SDA4 may be a region that extends from a fourth side of the main display area MDA and is curved at a certain curvature. The fourth side display area SDA4 may extend from an upper side of the main display area MDA. The fourth side display area SDA4 may be arranged at an upper side surface of the display apparatus 1.

The corner display areas CDA may extend from corners of the main display area MDA and may be curved at a certain curvature. The corner display areas CDA may be arranged between the first to fourth side display areas SDA1 to SDA4. In one embodiment, for example, the corner display areas CDA may be arranged between the first side display area SDA1 and the second side display area SDA2, between the first side display area SDA1 and the third side display area SDA3, between the second side display area SDA2 and the fourth side display area SDA4, and between the third side display area SDA3 and the fourth side display area SDA4.

The display apparatus 1 may provide images by using main pixels PXm arranged in the main display area MDA, side pixels PXs arranged in the side display area SDA, and corner pixels PXc arranged in the corner display area CDA.

In an embodiment, an image displayed on the corner display area CDA and/or the side display area SDA may be an auxiliary image, and may have a lower resolution as compared with an image displayed on the main display area MDA. In such an embodiment, the number of corner pixels PXc per unit area in the corner display area CDA may be less than the number of main pixels PXm arranged per unit area in the main display area MDA. In an embodiments, a resolution of the side display area SDA may be equal to or less than that of the main display area MDA.

Figure 2:
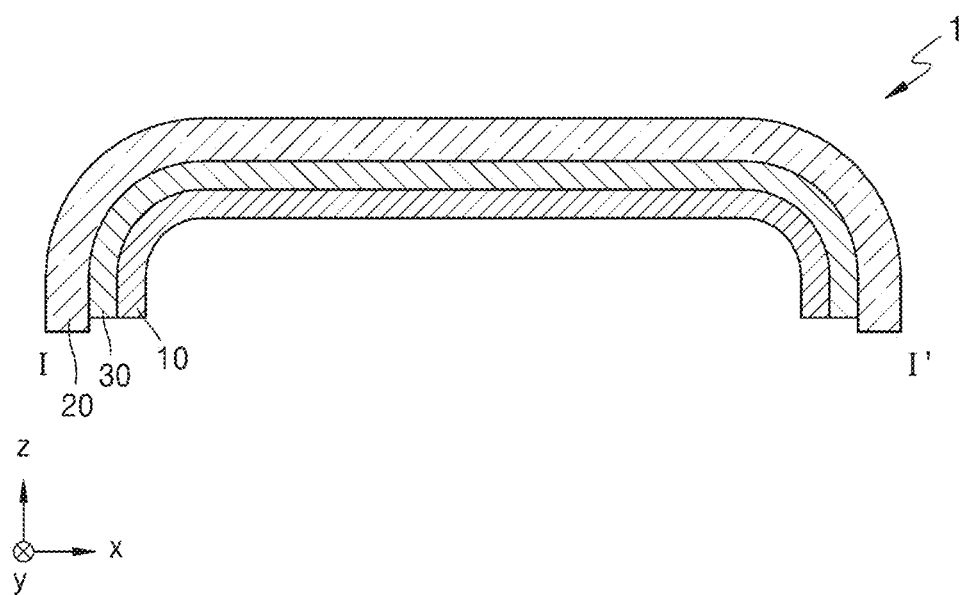
FIG. 2 is a cross-sectional view of the display apparatus taken along line I-I' of FIG. 1.

FIG. 2 is a cross-sectional view of the display apparatus taken along line I-I' of FIG. 1.

Referring to FIG. 2, an embodiment of the display apparatus 1 may include a display panel 10 and a cover window 20 arranged (or disposed) on the display panel 10.

The cover window 20 may cover and protect the display panel 10. The cover window 20 may include a transparent material. The cover window 20 may include, for example, glass or plastic. In an embodiment where the cover window 20 includes plastic, the cover window 20 may be flexible.

A shape of the cover window 20 corresponds to that of the display apparatus 1. In one embodiment, for example, where the display apparatus 1 includes the side display area SDA and the corner display areas CDA, the cover window 20 may also include a side surface portion corresponding to the side display area SDA and corner portions corresponding to the corner display areas CDA. In an embodiment, the side surface portion and the corner portion of the cover window 20 may be curved, and the side surface portion and the corner portion may each have a constant curvature or a variable curvature.

The display panel 10 may be under the cover window 20. The cover window 20 and the display panel 10 may be coupled to each other via an adhesive member 30. The adhesive member 30 may include an optically cleared adhesive ("OCA") film or an optically cleared resin ("OCR").

Figure 3A:
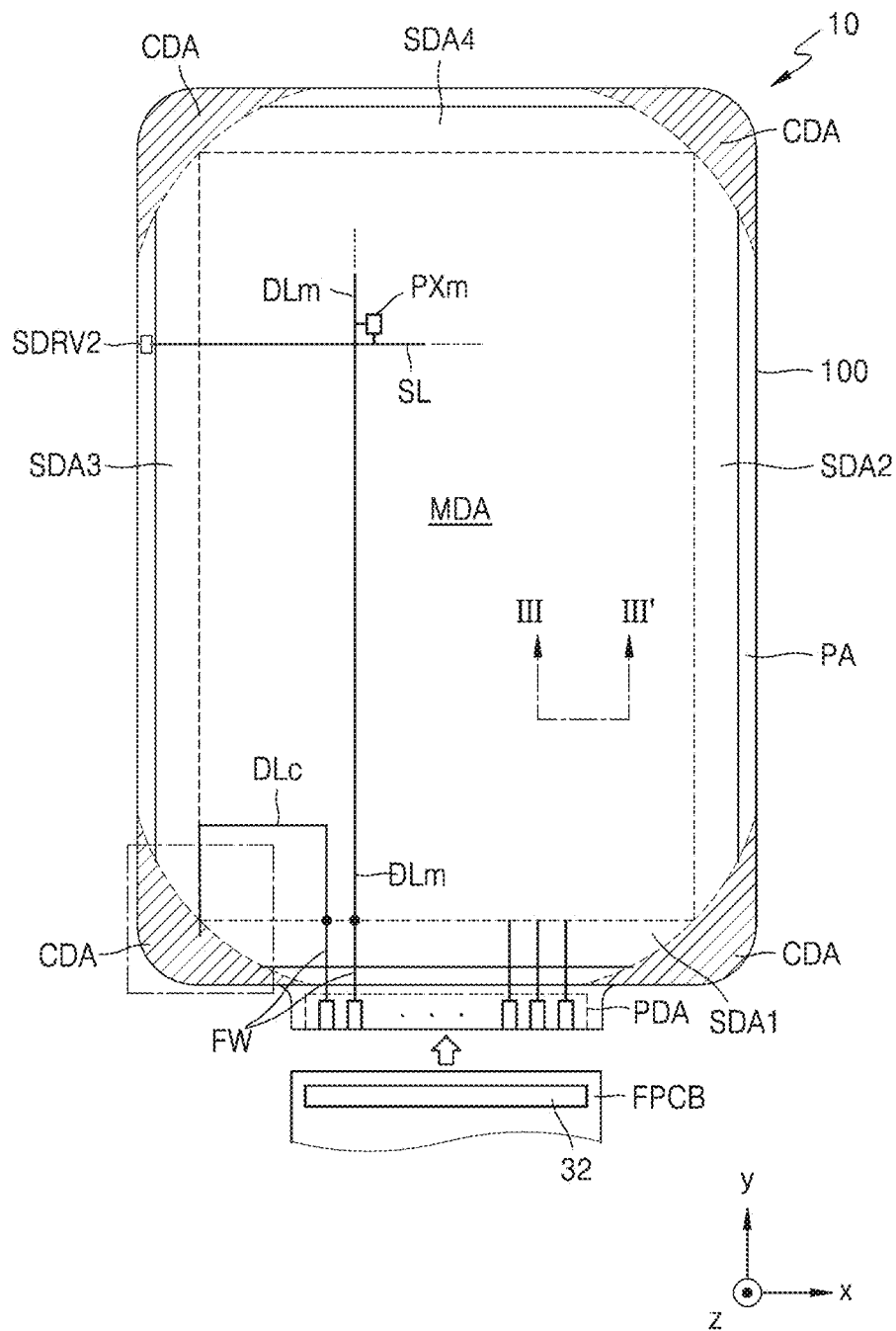
FIG. 3A is a plan view of a display panel in the display apparatus of FIG. 1 in an unfolded state.
Figure 3B:
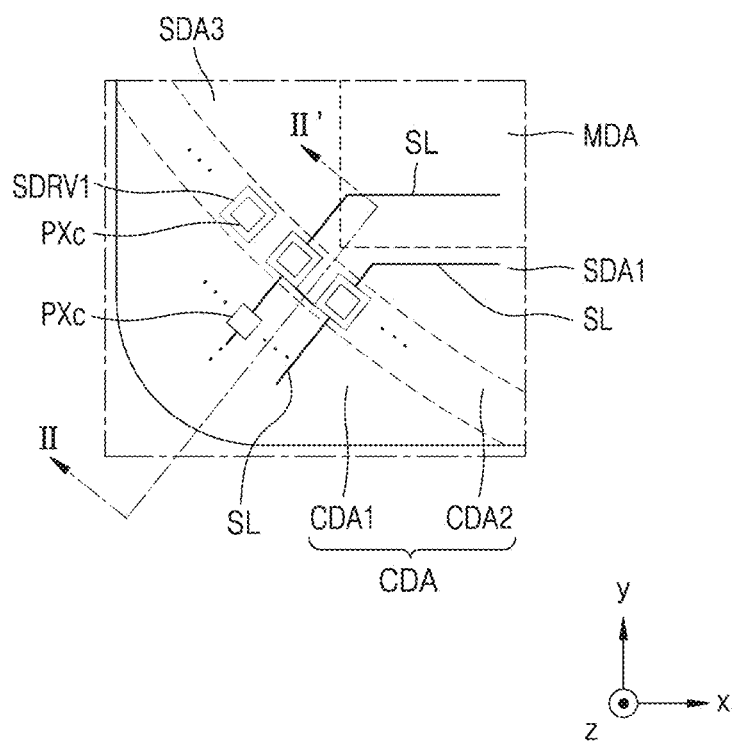
FIG. 3B is an enlarged view of the encircled portion of FIG. 3A.

FIG. 3A is a plan view showing the display panel that in the display apparatus 1 of FIG. 1 in an unfolded state, and FIG. 3B is an enlarged view of the encircled portion of FIG. 3A.

Referring to FIG. 3A, various elements of the display panel 10 are on a substrate 100. The substrate 100 may include the main display area MDA, the side display area SDA, the corner display areas CDA, and a peripheral area PA.

The main display area MDA includes the plurality of main pixels PXm, by which a main image may be displayed. The main pixels PXm may each include a group of sub-pixels. Each of the sub-pixels may emit red light, green light, blue light, or white light.

The side display area SDA may be at upper, lower, left, and right sides of the main display area MDA. The side pixels PXs are in the side display area SDA, and may display side images. The side image may form a single entire image with the main image, or may be a separate image independent from the main image.

The corner display area CDA may be at the region extending from a corner of the main display area MDA. The corner display area CDA may be between two side display areas SDA. A plurality of corner pixels PXc are in the corner display area CDA, and may display a corner image. The corner image may form a single unitary image with the main image and the side image, or may be a separate image independent from the main image.

In an embodiment, as shown in FIG. 3B, the corner display area CDA may include a first corner display area CDA1 and a second corner display area CDA2. The first corner display area CDA1 is at an edge of the substrate 100 or further away toward the edge than the second corner display area CDA2, and the second corner display area CDA2 may be between the first corner display area CDA1 and the main display area MDA.

In addition to the corner pixels PXc, a first scan driving circuit SDRV1 may be in the second corner display area CDA2. The first scan driving circuit SDRV1 may provide the corner pixels PXc with scan signals for driving the corner pixels PXc in the corner display area CDA. In such an embodiment, the first scan driving circuit SDRV1 may provide scan signals for driving the main pixels PXm or the side pixels PXs in the main display area MDA or the side display area SDA. In an embodiment, the first scan driving circuit SDRV1 may be connected to a pixel circuit for driving the corner pixels PXc and a pixel circuit for driving the main pixels PXm, and may provide the pixel circuits with a same scan signals. In such an embodiment, a scan line SL connected to the first scan driving circuit SDRV1 may extend to the main display area MDA and the corner display area CDA from opposite sides of the first scan driving circuit SDRV1.

The peripheral area PA may be on an outer side of the side display area SDA. A second scan driving circuit SDRV2 and a terminal portion (or a pad area) PDA may be in the peripheral area PA.

The second scan driving circuit SDRV2 may provide scan signals for driving the main pixels PXm and the side pixels PXs. The second scan driving circuit SDRV2 may be at a right side of the second side display area SDA2 and/or a left side of the third side display area SDA3, and may be connected to the scan line SL extending in an x-direction.

The terminal portion PDA may be at a lower side of the first side display area SDA1. The terminal portion PDA may not be covered by an insulating layer, but is exposed to be connected to a display circuit board FPCB. A display driver 32 may be on the display circuit board FPCB.

The display driver 32 may generate control signals that are to be transferred to the first scan driving circuit SDRV1 and the second scan driving circuit SDRV2. In such an embodiment, the display driver 32 may generate a data signal. The data signal may be transferred to the pixels PXm, PXs, and PXc via a fan-out wire FW and a data line DL connected to the fan-out wire FW. A main data line DLm may extend in a y-direction and may be connected to pixel circuits for driving the main pixels PXm. A corner data line DLc may be bent in the main display area MDA and extend to the corner display area CDA. The corner data line DLc may be connected to the pixel circuits driving the corner pixels PXc.

Figure 4:
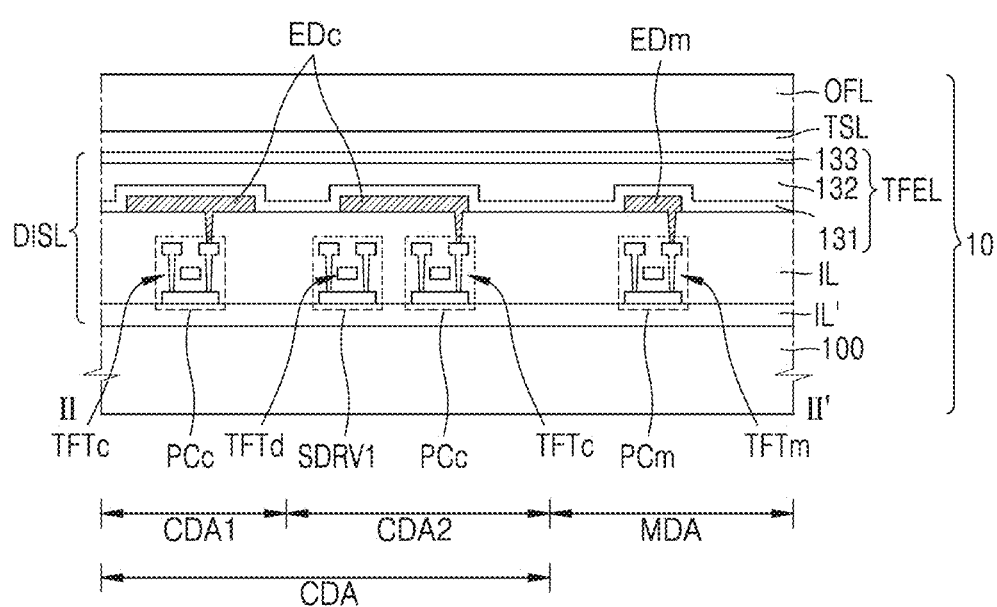
FIG. 4 is a cross-sectional view of the display panel taken along line II-II' of FIG. 3.

FIG. 4 is a cross-sectional view of the display panel 10 taken along line II-II' of FIG. 3.

Referring to FIG. 4, an embodiment of the display panel 10 includes the corner display area CDA and the main display area MDA, and the corner display area CDA may include the first corner display area CDA1 and the second corner display area CDA2. The display panel 10 may include the substrate 100, and a display layer DISL, a touch screen layer TSL and an optical functional layer OFL, which are on the substrate 100.

The display layer DISL may include a circuit layer PCL including thin film transistors TFTm, TFTc, and TFTd, a light-emitting elements EDm and EDc that are display elements, and a thin film encapsulation layer TFEL. Insulating layers IL and IL' may be between the substrate 100 and the display layer DISL, and in the display layer DISL.

The substrate 100 may include an insulating material, such as glass, quartz, and polymer resin. The substrate 100 may include a rigid substrate or a flexible substrate that may be bendable, foldable, and rollable.

A main pixel circuit PCm and a main light-emitting element EDm connected to the main pixel circuit PCm may be in a main display area MDA of the display panel 10. The main pixel circuit PCm may include a thin film transistor TFTm and may control light emission from the main display element EDm.

Corner pixel circuits PCc and corner display elements EDc connected to the corner pixel circuits PCc may be in the first corner display area CDA1 and the second corner display area CDA2 of the display panel 10. The corner pixel circuit PCc may include a thin film transistor TFTc and may control light emission from the corner display element EDc.

In an embodiment, the first scan driving circuit SDRV1 may be further in the second corner display area CDA2. The first scan driving circuit SDRV1 may include a thin film transistor TFTd, and may provide the corner pixel circuits PCc in the corner display area CDA with scan signals. The corner display elements EDc in the first corner display area CDA1 and the second corner display area CDA2 may have a same pixel arrangements as each other. Due to the uniform pixel arrangements in the corner display elements EDc, the corner display element EDc in the second corner display area CDA2 may overlap the first scan driving circuit SDRV1.

In an embodiment, the corner display area CDA is an auxiliary display area and a resolution of the corner display area CDA may be less than that of the main display area MDA. In such an embodiment, the number of corner display elements EDc per unit area in the corner display area CDA may be less than the number of main display elements EDm per unit area in the main display area MDA.

The corner display elements EDc in the corner display area CDA may be larger than the main display elements EDm in the main display area MDA. In one embodiment, for example, an emission area of the corner display element EDc may be larger than that of the main display element EDm in the main display area MDA. Thus, the corner display area CDA having lower resolution may provide a luminance that is the same as or similar to that of the main display area MDA.

The main display element EDm and the corner display element EDc that are the display elements may be covered by the thin film encapsulation layer TFEL. In an embodiment, the thin film encapsulation layer TFEL may include at least one inorganic encapsulation layer and at least one organic encapsulation layer as shown in FIG. 4. In an embodiment, the thin film encapsulation layer TFEL may include first and second inorganic encapsulation layers 131 and 132 and an organic encapsulation layer 132 between the first and second inorganic encapsulation layers 131 and 133.

The first and second inorganic encapsulation layers 131 and 133 may each include at least one inorganic insulating materials selected from silicon oxide ($SiO_2$), silicon nitride (SiNx), silicon oxynitride (SiOxNy), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a chemical vapor deposition ("CVD") method, etc. The organic encapsulation layer 132 may include a polymer-based material. The polymer-based material may include at least one selected from a silicon-based resin, an acryl-based resin, an epoxy-based resin, polyimide and polyethylene, for example.

The touch screen layer TSL may obtain coordinate information corresponding to an external input, e.g., a touch event. The touch screen layer TSL may include a touch electrode and touch lines connected to the touch electrode. The touch screen layer TSL may sense an external input based on a self-capacitance method or a mutual capacitance method.

In an embodiment, the touch screen layer TSL may be on, e.g., provided directly on, the thin film encapsulation layer TFEL. Alternatively, the touch screen layer TSL may be separately formed on a touch substrate, and then may be coupled onto the thin film encapsulation layer TFEL via an adhesive layer such as an optical clear adhesive ("OCA"). In an embodiment, the touch screen layer TSL may be directly on the thin film encapsulation layer TFEL, and the adhesive layer may not be provided between the touch screen layer TSL and the thin film encapsulation layer TFEL.

The optical functional layer OFL may include an anti-reflection layer. The anti-reflection layer may reduce a reflectivity of light (external light) incident into the display apparatus 1 from the outside. In an embodiments the optical functional layer OFL may include a polarization film. In an embodiment, the optical functional layer OFL may include a filter plate including a black matrix and color filters.

The display panel 10 may be a light-emitting display panel including a light-emitting element. In one embodiment, for example, the display panel 10 may include an organic light-emitting display panel using an organic light-emitting diode as a light-emitting element, a micro-LED display panel using a micro-LED as a light-emitting element, a quantum dot organic light-emitting display panel using quantum dots and an organic light-emitting diode, or an inorganic light-emitting display panel using inorganic semiconductor as a light-emitting element. Hereinafter, for convenience of description, embodiments where the display panel 10 includes an organic light-emitting display panel will be described in detail, but not being limited thereto.

Figure 5:
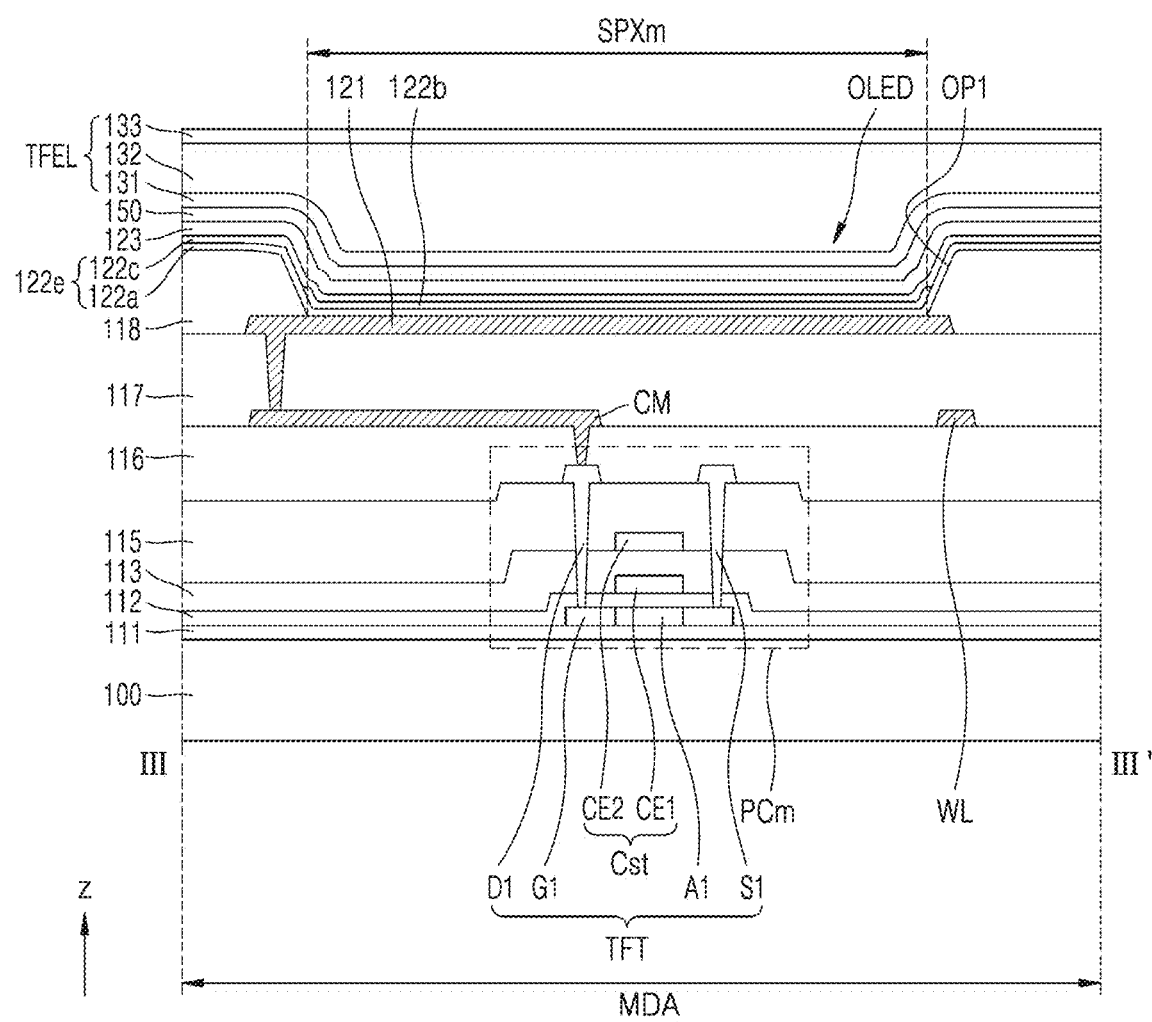
FIG. 5 is a cross-sectional view of the display panel taken along line III-III' of FIG. 3.

FIG. 5 is a cross-sectional view of the display panel 10 taken along line III-Ill' of FIG. 3.

Referring to FIG. 5, the main pixel circuit PCm including a thin film transistor TFT and a storage capacitor Cst and an organic light-emitting diode OLED that is a display element connected to the main pixel circuit PCm may be in the main display area MDA. An emission area of the organic light-emitting diode OLED may configure or define one main sub-pixel SPXm.

Hereinafter, a structure in which the elements in the display panel 10 are stacked will be described below.

The substrate 100 may include an insulating material, such as glass, quartz, and polymer resin. The substrate 100 may include a rigid substrate or a flexible substrate that may be bendable, foldable, and rollable. In an embodiment, the substrate 100 may have a structure in which an organic layer and an inorganic layer are stacked alternately one on another.

A buffer layer 111 is on the substrate 100 to reduce or block infiltration of impurities, moisture, or external air from a lower portion of the substrate 100, and to provide a flat surface on the substrate 100. The buffer layer 111 may include an inorganic material such as an oxide material or a nitride material, an organic material, or an inorganic-organic composite material, and may have a single-layered or multi-layered structure, each layer therein including the inorganic material and the organic material. A barrier layer (not shown) for preventing infiltration of external air may be further provided between the substrate 100 and the buffer layer 111. In an embodiment, the buffer layer 111 may include silicon oxide ($SiO_2$) or silicon nitride (SiNx).

The thin film transistor TFT may be on the buffer layer 111. The thin film transistor TFT includes a first semiconductor layer A1, a first gate electrode G1, a first source electrode S1, and a first drain electrode D1. The thin film transistor TFT is connected to the organic light-emitting diode OLED to drive the organic light-emitting diode OLED.

The first semiconductor layer A1 is on the buffer layer 111, and may include polysilicon. In an alternative embodiment, the first semiconductor layer A1 may include amorphous silicon. In another alternative embodiment, the first semiconductor layer A1 may include an oxide of at least one selected from indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel region, and a source region and a drain region doped with impurities.

A first gate insulating layer 112 may cover the first semiconductor layer A1. The first gate insulating layer 112 may include an inorganic insulating material such as silicon oxide ($SiO_2$), silicon nitride (SiNx), silicon oxynitride (SiOxNy), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure, each layer therein including the inorganic insulating material.

The first gate electrode G1 is on the first gate insulating layer 112 to overlap the first semiconductor layer A1. The first gate electrode G1 may include molybdenum (Mo), aluminum (Al), copper (Cu), titanium (Ti), etc., and may have a single-layered or multi-layered structure. In one embodiment, for example, the first gate electrode G1 may have a single layer including Mo.

A second gate insulating layer 113 may cover the first gate electrode G1. The second gate insulating layer 113 may include an inorganic insulating material such as silicon oxide ($SiO_2$), silicon nitride (SiNx), silicon oxynitride (SiOxNy), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure, each layer therein including the inorganic insulating material.

An upper electrode CE2 of the storage capacitor Cst may be on the second gate insulating layer 113. The upper electrode CE2 of the storage capacitor Cst may overlap the first gate electrode G1 thereunder. The first gate electrode G1 and the upper electrode CE2 overlapping each other with the second gate insulating layer 113 therebetween may configure or collectively define the storage capacitor Cst. The first gate electrode G1 may be a lower electrode CE1 of the storage capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layered or multi-layered structure.

An interlayer insulating layer 115 may cover the upper electrode CE2. The interlayer insulating layer 115 may include an insulating material such as silicon oxide ($SiO_2$), silicon nitride (SiNx), silicon oxynitride (SiOxNy), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 115 may have a single-layered or a multi-layered structure, each layer therein including the inorganic insulating material.

The source electrode S1 and the drain electrode D1 may be on the interlayer insulating layer 115. The source electrode S1 and the drain electrode D1 may include a conductive material including molybdenum (Mo), aluminum (Al), copper (Cu), titanium (Ti), etc., and may have a single-layered or multi-layered structure, each layer therein including at least one selected from the above materials. In one embodiment, for example, the source electrode S1 and the drain electrode D1 may each have a multi-layered structure, each layer therein including Ti/Al/Ti.

A first organic insulating layer 116 may be on the source electrode S1 and the drain electrode D1. The first organic insulating layer 116 may include photosensitive polyimide, polyimide, polystyrene ("PS"), polycarbonate ("PC"), a general universal polymer such as benzocyclobutene ("BCB"), hexamethyldisiloxane ("HMDSO"), polymethylmethacrylate ("PMMA"), or polystyrene ("PS"), polymer derivatives having phenol groups, acryl-based polymer, imide-based polymer, aryl ether-based polymer, amide-based polymer, fluoride-based polymer, p-xylene-based polymer or vinyl alcohol-based polymer, for example.

Alternatively, the first organic insulating layer 116 may include a siloxane-based organic material. The siloxane-based organic material may include hexamethyldisiloxane, octamethyltrisiloxane, decamethyltetrasiloxane, dodecamethylpentasiloxane, or polydimethylsiloxanes.

A connecting electrode CM and various lines WL, e.g., a driving voltage line or a data line, may be on the first organic insulating layer 116 with high integration.

A second organic insulating layer 117 may be on the first organic insulating layer 116, to cover the connecting electrode CM and the lines WL. The second organic insulating layer 117 may have a flat upper surface so that a pixel electrode 121 that is arranged thereon may be planarized. The second organic insulating layer 117 may include a siloxane-based organic material having high light transmittance and flatness. The siloxane-based organic material may include hexamethyldisiloxane, octamethyltrisiloxane, decamethyltetrasiloxane, dodecamethylpentasiloxane, or polydimethylsiloxanes.

Alternatively, the second organic insulating layer 117 may include photosensitive polyimide, polyimide, a general universal polymer (BCB, HMDSO, PMMA, or PS), polymer derivatives having phenol groups, acryl-based polymer, imide-based polymer, aryl ether-based polymer, amide-based polymer, fluoride-based polymer, p-xylene-based polymer, or vinyl alcohol-based polymer.

The organic light-emitting diode OLED may be on the second organic insulating layer 117. A pixel electrode 121 of the organic light-emitting diode OLED may be connected to the main pixel circuit PCm via the connecting electrode CM on the first organic insulating layer 116.

The pixel electrode 121 may include a conductive oxide such as indium tin oxide ("ITO"), indium zinc oxide ("IZO"), zinc oxide (ZnO), indium oxide ($In_2O_3$), indium gallium oxide, or aluminum zinc oxide ("AZO"). The pixel electrode 121 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. In one embodiment, for example, the pixel electrode 121 may have a structure in which films including ITO, IZO, ZnO, or $In_2O_3$ are on/under the above-mentioned reflective layer. In such an embodiment, the pixel electrode 121 may include a stack structure of ITO/Ag/ITO.

A pixel defining layer 118 may be on the second organic insulating layer 117 to cover an edge portion of the pixel electrode 121, and a first opening OP1 is defined through the pixel defining layer 118 to expose a center portion of the pixel electrode 112. A size and a shape of an emission area of the organic light-emitting diode OLED, that is, the sub-pixel SPXm, are defined by the first opening OP1.

The pixel defining layer 118 increases a distance between an edge of the pixel electrode 121 and an opposite electrode 123 on the pixel electrode 121 to prevent generation of arc at the edge of the pixel electrode 121. The pixel-defining layer 118 may include an organic insulating material such as polyimide, polyamide, acrylic resin, BCB, HMDSO, and phenolic resin, and may be formed by a spin coating.

A first emission layer 122b is in the first opening OP1 of the pixel defining layer 118, to correspond to the pixel electrode 121. The first emission layer 122b may include a polymer material or a low-molecular weight material, and may emit red light, green light, blue light, or white light.

An organic functional layer 122e may be on and/or under the first emission layer 122b. The organic functional layer 122e may include a first functional layer 122a and/or a second functional layer 122c. Alternatively, the first functional layer 122a or the second functional layer 122c may be omitted.

The first functional layer 122a may be under the first emission layer 122b. The first functional layer 122a may have a single-layered or multi-layered structure, each layer therein including an organic material. The first functional layer 122a may include a hole transport layer ("HTL") having a single-layered structure. Alternatively, the first functional layer 122a may include a hole injection layer ("HIL") and the HTL. The first functional layer 122a may be integrally or commonly formed to correspond to the organic light-emitting diodes OLED included in the main display area MDA.

The second functional layer 122c may be on the first emission layer 122b. The second functional layer 122c may have a single-layered or multi-layered structure, each layer therein including an organic material. The second functional layer 122c may include an electron transport layer ("ETL") and/or an electron injection layer ("EIL"). The second functional layer 122c may be integrally or commonly formed to correspond to the organic light-emitting diodes OLED included in the main display area MDA.

The opposite electrode 123 is on the second functional layer 122c. The opposite electrode 123 may include a conductive material having a low work function. In one embodiment, for example, the opposite electrode 123 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 123 may further include a layer including ITO, IZO, ZnO, or $In_2O_3$ on the (semi-)transparent layer including the above material. The opposite electrode 123 may be integrally or commonly formed to correspond to the organic light-emitting diodes OLED included in the main display area MDA.

Layers from the pixel electrode 121 and the opposite electrode 123 in the main display area MDA may configure the organic light-emitting diode OLED.

An upper layer 150 including an organic material may be on the opposite electrode 123. The upper layer 150 may be provided to protect the opposite electrode 123 and to improve light extraction efficiency. The upper layer 150 may include an organic material having a higher refractive index than that of the opposite electrode 123. Alternatively, the upper layer 150 may include stacked layers having different refractive indices. In one embodiment, for example, the upper layer 150 may include a high refractive index layer/low refractive index layer/high refractive index layer. The high refractive index layer may have a refractive index of about 1.7 or greater and the low refractive index layer may have a refractive index of about 1.3 or less.

The upper layer 150 may additionally include LiF. Alternatively, the upper layer 150 may additionally include an inorganic insulating material such as silicon oxide ($SiO_2$) and silicon nitride (SiNx).

The thin film encapsulation layer TFEL may be on the upper layer 150. The thin film encapsulation layer TFEL may prevent external moisture or impurities from infiltrating into the organic light-emitting diode OLED.

The thin film encapsulation layer TFEL may include at least one inorganic encapsulation layer and at least one organic encapsulation layer. In an embodiment, as shown in FIG. 5, the thin film encapsulation layer TFEL may include the first inorganic encapsulation layer 131, the organic encapsulation layer 132, and the second inorganic encapsulation layer 133, which are stacked one on another therein. In an alternative embodiment, a stacking order and the number of organic and inorganic encapsulation layers may vary.

The first and second inorganic encapsulation layers 131 and 133 may each include one or more inorganic insulating materials such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a chemical vapor deposition (CVD) method, etc. The organic encapsulation layer 132 may include a polymer-based material. The polymer-based material may include a silicon-based resin, an acryl-based resin, an epoxy-based resin, polyimide, or polyethylene, for example. The first inorganic encapsulation layer 131, the organic encapsulation layer 132, and the second inorganic encapsulation layer 133 may be integrally provided to cover the main display area MDA.

FIG. 5 shows an embodiment of the stack structure of the main display area MDA, but the stack structure may be also applied to the side display area SDA and the corner display area CDA.

Figure 6:
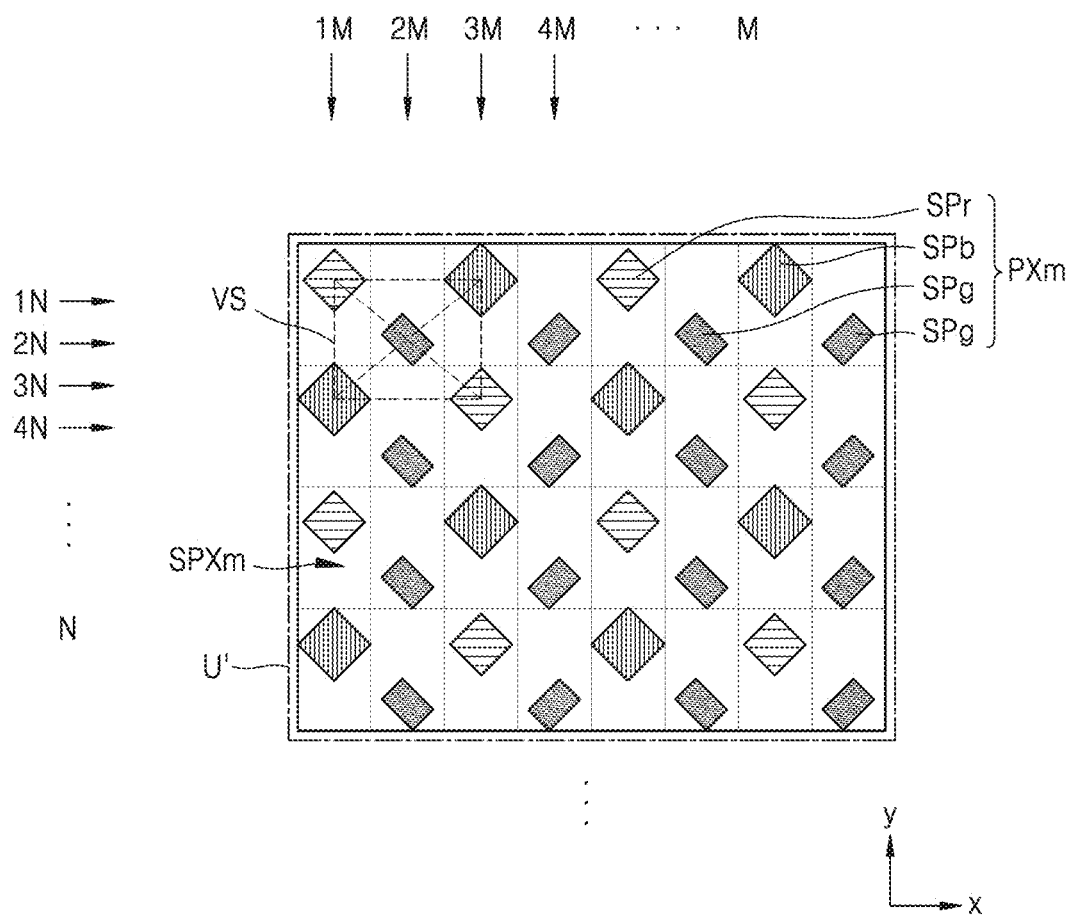
FIG. 6 is a diagram showing a pixel arrangement structure that may be applied to a main display area, according to an embodiment.

FIG. 6 is a diagram showing a pixel arrangement structure that may be applied to the main display area MDA, according to an embodiment.

Referring to FIG. 6, a plurality of main sub-pixels SPXm may be in the main display area MDA. Herein, the sub-pixel is a minimum unit for realizing an image and denotes a light-emitting region. The main pixel PXm may include a set of main sub-pixels SPXm. The main pixel PXm may include a first sub-pixel PSr, a second sub-pixel PSg, and a third sub-pixel PSb that emit light of different colors from each other. The first sub-pixel PSr, the second sub-pixel PSg, and the third sub-pixel PSb may respectively emit red light, green light, and blue light. In an embodiment, one main pixel PXm may include one first sub-pixel PSr, two second sub-pixels PSg, and one third sub-pixel PSb.

In an embodiment, as shown in FIG. 6, the main sub-pixels SPXm in the main display area MDA may be arranged in a Pentile structure.

In a first row 1N, a plurality of first sub-pixels SPr and a plurality of third sub-pixels SPb are alternately provided, and in an adjacent second row 2N, a plurality of second sub-pixels SPg are spaced apart from one another, in an adjacent third row 3N, the third sub-pixels SPb and the first sub-pixels SPr are alternately provided, and in an adjacent fourth row 4N, a plurality of second sub-pixels SPg are spaced apart from one another. In addition, the above arrangements are repeated to an N-th row. In such an embodiment, the third sub-pixel SPb and the first sub-pixel SPr may be larger than the second sub-pixel SPg.

The plurality of first sub-pixels SPr and the third sub-pixels SPb in the first row 1N and the plurality of second sub-pixels SPg in the second row 2N are arranged crossing each other. Therefore, the first sub-pixels SPr and the third sub-pixels SPb are alternately arranged in a first column 1M, the plurality of second sub-pixels SPg are arranged in an adjacent second column 2M with a certain distance therebetween, the third sub-pixels SPb and the first sub-pixels SPr are alternately arranged in an adjacent third column 3M, and the plurality of second sub-pixels SPg are arranged in an adjacent fourth column 4M with a certain distance therebetween. In such an embodiment, the above arrangement of the pixels is repeated to an M-th column.

In such an embodiment, from among vertexes of a virtual square VS having a center of the second sub-pixel SPg as a center thereof, the first sub-pixels SPr are arranged at first and third vertexes facing each other, and the third sub-pixels SPb may be arranged at remaining vertexes, that is, second and fourth vertexes. Here, the virtual square VS may be variously modified as, for example, a rectangle, a rhombus, a square, etc.

This pixel arrangement structure is referred to as a Pentile matrix structure or a Pentile structure. By applying rendering, in which a color of a pixel is represented by sharing the colors of adjacent pixels thereof, a high resolution may be obtained via a small number of pixels.

FIG. 6 shows that the plurality of main sub-pixels SPXm are arranged in the Pentile matrix structure, but one or more embodiments are not limited thereto. In one alternative embodiment, for example, the plurality of main sub-pixels SPXm may be arranged in at least one of various shapes, e.g., a stripe structure, a mosaic arrangement structure, a delta arrangement structure, etc.

Figure 7:
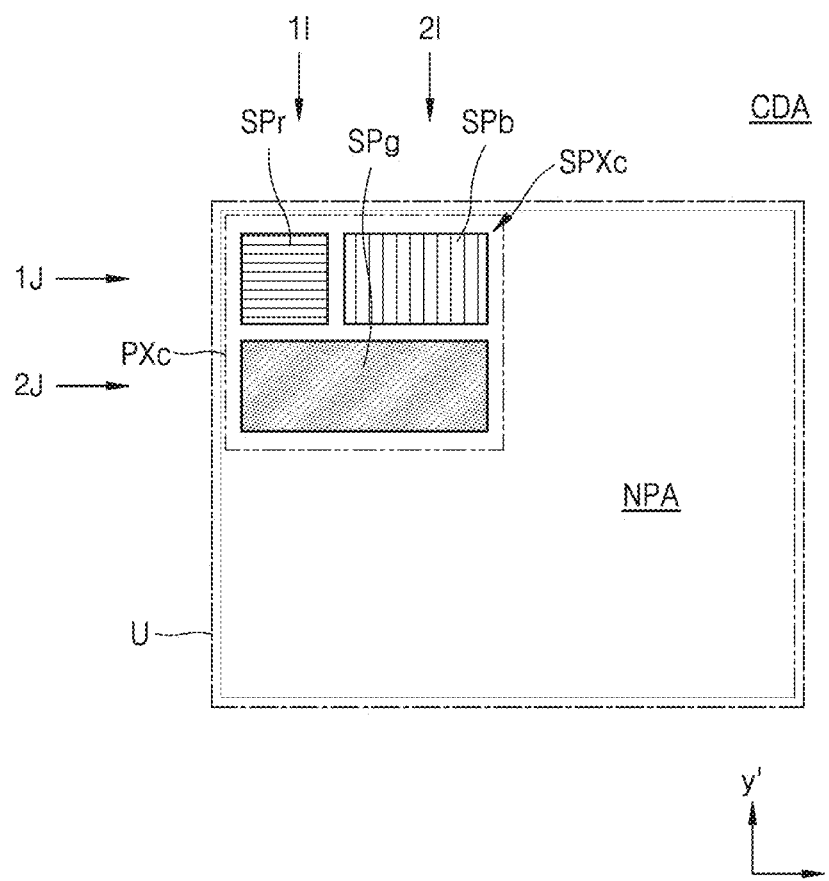
FIG. 7 is a diagram showing a pixel arrangement structure that may be applied to a corner display area, according to an embodiment.

FIG. 7 is a diagram showing a pixel arrangement structure that may be applied to the corner display area CDA according to an embodiment.

Referring to FIG. 7, a plurality of corner sub-pixels SPXc may be in the corner display area CDA. The corner pixel PXc may include a set of corner sub-pixels SPXc. The corner pixel PXc may include a first sub-pixel PSr, a second sub-pixel PSg, and a third sub-pixel PSb that emit light of different colors from each other. The first sub-pixel PSr, the second sub-pixel PSg, and the third sub-pixel PSb may respectively emit red light, green light, and blue light. In an embodiment, one corner pixel PXc may include three corner sub-pixels SPXc, e.g., the first sub-pixel PSr, the second sub-pixel PSg, and the third sub-pixel PSb.

In an embodiment, in a first row 1J, the first sub-pixel SPr and the third sub-pixel PSb may be alternately arranged, and in an adjacent second row 2J, the second sub-pixel PSg may be arranged.

In such an embodiment, the second sub-pixel PSg may be arranged throughout a first column 1I and a second column 2I. In such an embodiment, the second sub-pixel SPg may be provided as a rectangular shape having long sides in an x'-direction.

A length of the second sub-pixel SPg in the x'-direction may be equal to or greater than a sum of a length of the first sub-pixel SPr in the x'-direction and a length of the third sub-pixel SPb in the x'-direction. Accordingly, a size of the second sub-pixel SPg may be greater than those of the first sub-pixel SPr and the third sub-pixel SPb. The above arrangement is referred to as an S-stripe structure.

In the corner display area CDA, basic units U, each of which includes the preset number of corner pixels PXc and a non-pixel area NPA in which pixels are not provided, may be repeatedly arranged in the x'-direction and a y'-direction. In an embodiment, as shown in FIG. 7, the basic unit U may have a rectangular shape, in which one corner pixel PXc and the non-pixel area NPA around the corner pixel PXc are included. The basic units U are obtained by partitioning repeated shapes, and do not denote disconnection of the elements.

A corresponding unit U' having a same area as that of the basic unit U may be set in the main display area MDA. In such an embodiment, the number of main sub-pixels SPXm included in the corresponding unit U' may be greater than that of the corner sub-pixels SPXc included in the basic unit U. In such an embodiment, the number of corner sub-pixels SPXc included in the basic unit U may be three, and the number of main sub-pixels SPXm included in the corresponding unit U' may be 32.

In such an embodiment, an area occupied by one corner pixel PXc in the basic unit U may be about ¼ of the basic unit U. In an embodiment, as shown in FIG. 7, the basic unit U includes only one corner pixel PXc, but not being limited thereto. In an alternative embodiment, the basic unit U may include two or more corner pixels PXc. The number or arrangement type of the corner sub-pixels SPXc included in the corner pixel PXc may be variously modified based on a resolution of the corner display area CDA. In such an embodiment, the areas of the corner sub-pixels SPXc included in the corner pixel PXc may be variously modified.

Figure 8A:
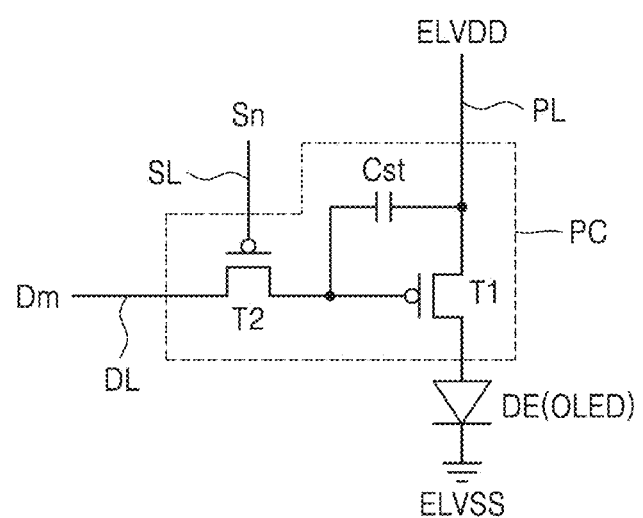
FIGS. 8A and 8B are equivalent circuit diagrams of a pixel circuit driving a sub-pixel, according to one or more embodiments.
Figure 8B:
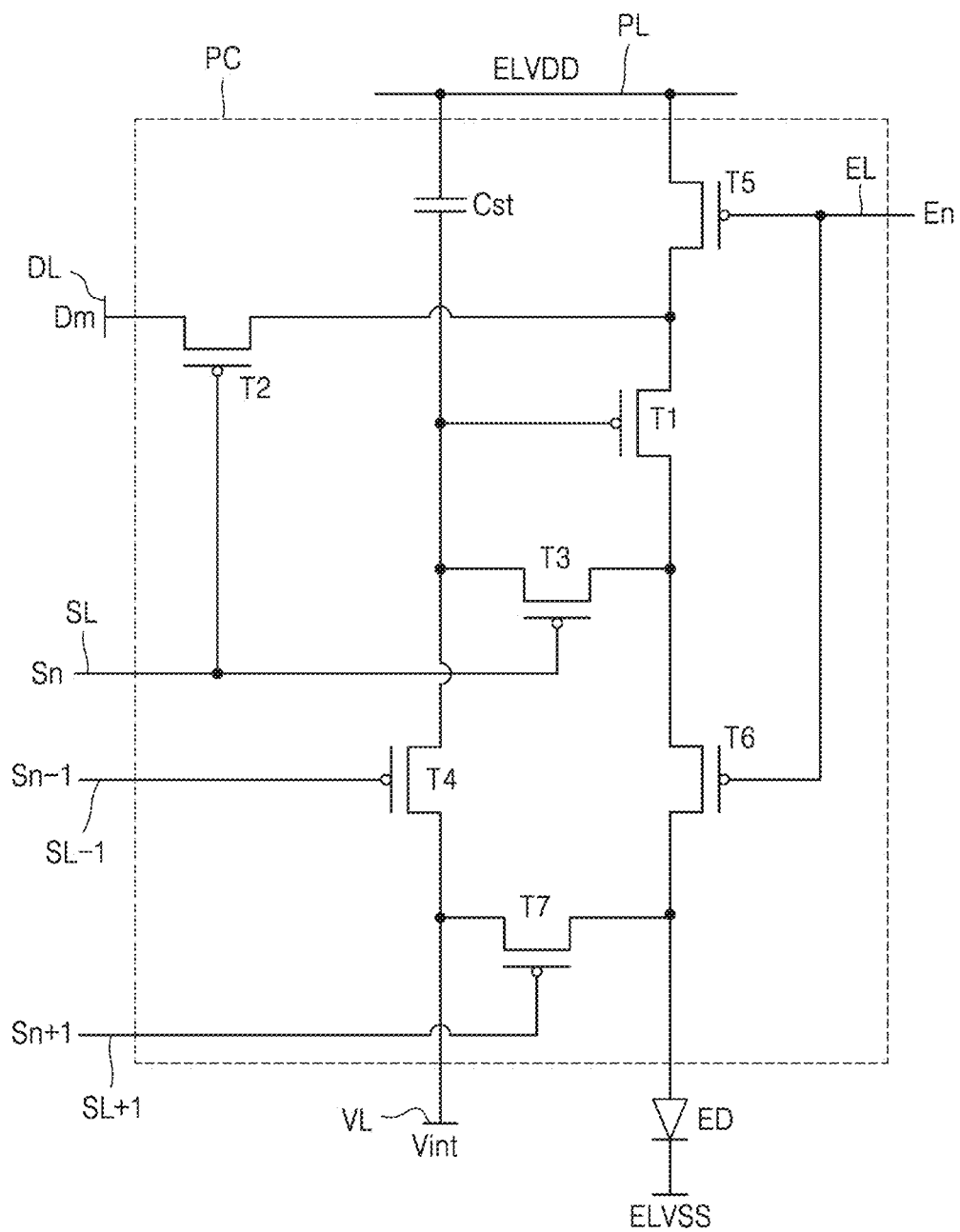

FIGS. 8A and 8B are equivalent circuit diagrams of a pixel circuit driving sub-pixels SPXm and SPXc, according to one or more embodiments.

Referring to FIG. 8A, in an embodiment, the pixel circuit PC may be connected to a light-emitting element ED to realize light emission from sub-pixels. The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 in response to a scan signal Sn input through the scan line SL.

The storage capacitor Cst is connected to the switching thin film transistor T2 and a driving voltage line PL and stores a voltage corresponding to a difference between a voltage transferred from the switching thin film transistor T2 and a driving voltage ELVDD supplied to the driving voltage line PL.

The driving thin film transistor T1 is connected to the driving voltage line PL and the storage capacitor Cst and may control a driving current flowing from the driving voltage line PL to the light-emitting element ED in response to the voltage value stored in the storage capacitor Cst. The light-emitting element ED may emit light having a predetermined luminance corresponding to the driving current.

FIG. 8A shows an embodiment in which the pixel circuit PC includes two thin-film transistors and a single storage capacitor, but one or more embodiments are not limited thereto.

Referring to FIG. 8B, in an alternative embodiment, the pixel circuit PC may include the driving thin film transistor T1, the switching thin film transistor T2, a compensating thin film transistor T3, a first initialization thin film transistor T4, an operation control thin film transistor T5, an emission control thin film transistor T6, and a second initialization thin film transistor T7.

In such an embodiment, as shown in FIG. 8B, every pixel circuit PC includes signal lines SL, SL−1, SL+1, EL, DL, an initialization voltage line VL, and the driving voltage line PL, but one or more embodiments are not limited thereto. In an alternative embodiment, at least one of the signal lines SL, SL−1, SL+1, EL, and DL, and/or the initialization voltage line VL may be shared by neighboring pixel circuits.

A drain electrode of the driving thin film transistor T1 may be electrically connected to the light-emitting element ED via the emission control thin film transistor T6. The driving thin film transistor T1 receives the data signal Dm in response to a switching operation of the switching thin film transistor T2 to supply a driving current to the light-emitting element ED.

A gate electrode of the switching thin film transistor T2 is connected to the scan line SL, and a source electrode of the switching thin film transistor T2 is connected to the data line DL. A drain electrode of the switching thin film transistor T2 is connected to a source electrode of the driving thin film transistor T1, and at the same time, may be connected to the driving voltage line PL via the operation control thin film transistor T5.

The switching thin film transistor T2 is turned on according to a scan signal Sn received through the scan line SL and performs a switching operation for transferring the data signal Dm transferred through the data line DL to the source electrode of the driving thin film transistor T1.

A gate electrode of the compensation thin film transistor T3 may be connected to the scan line SL. A source electrode of the compensation thin film transistor T3 is connected to the drain electrode of the driving thin film transistor T1, and may be also connected to a pixel electrode of the light-emitting element ED via the emission control thin film transistor T6. A drain electrode of the compensating thin film transistor T3 may be connected to one electrode of the storage capacitor Cst, together with the source electrode of the first initialization thin film transistor T4 and the gate electrode of the driving thin film transistor T1. The compensation thin film transistor T3 is turned on in response to the scan signal Sn transferred through the scan line SL, and connects the gate electrode and the drain electrode of the driving thin film transistor T1 to each other for diode-connecting the driving thin film transistor T1.

A gate electrode of the first initialization thin film transistor T4 may be connected to the previous scan line SL−1. The drain electrode of the first initialization thin film transistor T4 may be connected to the initialization voltage line VL. A source electrode of the first initialization thin film transistor T4 may be connected to one electrode of the storage capacitor Cst, together with the drain electrode of the compensating thin film transistor T3 and the gate electrode of the driving thin film transistor T1. The first initialization thin film transistor T4 is turned on in response to a scan signal Sn−1 transferred through the previous scan line SL−1 to transfer an initialization voltage Vint to the gate electrode of the driving thin film transistor T1 and perform an initialization operation for initializing a voltage at the gate electrode of the driving thin film transistor T1.

A gate electrode of the operation control thin film transistor T5 may be connected to the emission control line EL. A source electrode of the operation control thin film transistor T5 may be connected to the driving voltage line PL. A drain electrode of the operation control thin film transistor T5 is connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the light-emitting element ED. The operation control thin film transistor T5 and the emission control thin film transistor T6 are simultaneously turned on in response to an emission control signal En transferred through the emission control line EL to transfer the driving voltage ELVDD to the light-emitting element ED, and a driving current flows through the light-emitting element ED.

The gate electrode of the second initialization thin film transistor T7 may be connected to a subsequent scan line SL+1. A source electrode of the second initialization thin film transistor T7 may be connected to the pixel electrode of the light-emitting element ED. A drain electrode of the second initialization thin film transistor T7 may be connected to the initialization voltage line VL. The second initialization thin-film transistor T7 is turned on in response to a subsequent scan signal Sn+1 transferred through the subsequent scan line SL+1 to initialize the pixel electrode of the light-emitting element ED.

FIG. 8B shows an embodiment, in which the first initialization thin film transistor T4 and the second initialization thin film transistor T7 are respectively connected to the previous scan line SL−1 and the subsequent scan line SL+1, but one or more embodiments are not limited thereto. In another alternative embodiment, the first initialization thin film transistor T4 and the second initialization thin film transistor T7 may be both connected to the previous scan line SL−1 to be operated in response to the previous scan signal Sn−1.

Another electrode of the storage capacitor Cst may be connected to the driving voltage line PL. One electrode of the storage capacitor Cst may be connected to the gate electrode of the driving thin film transistor T1, the drain electrode of the compensating thin film transistor T3, and the source electrode of the first initialization thin film transistor T4.

An opposite electrode (e.g., a cathode) of the light-emitting element ED may receive a supply of the common voltage ELVSS. The light-emitting element ED emits light after receiving a driving current from the driving thin film transistor T1.

The pixel circuit PC is not limited to the number and circuit design of the thin film transistors and the storage capacitor illustrated with reference to FIGS. 8A and 8B, and the number and the circuit design may be variously modified.

The pixel circuits PC for driving the main sub-pixel SPXm and the corner sub-pixel SPXc may have a same structures as or different structures from one another. In one embodiment, for example, the pixel circuits PC for driving the main sub-pixel SPXm and the corner sub-pixel SPXc may include the pixel circuit PC shown in FIG. 8B. In an alternative embodiment, the pixel circuit PC for driving the main sub-pixel SPXm may include the pixel circuit PC shown in FIG. 8B, and the pixel circuit PC for driving the corner sub-pixel SPXc may include the pixel circuit PC shown in FIG. 8A.

Figure 9A:
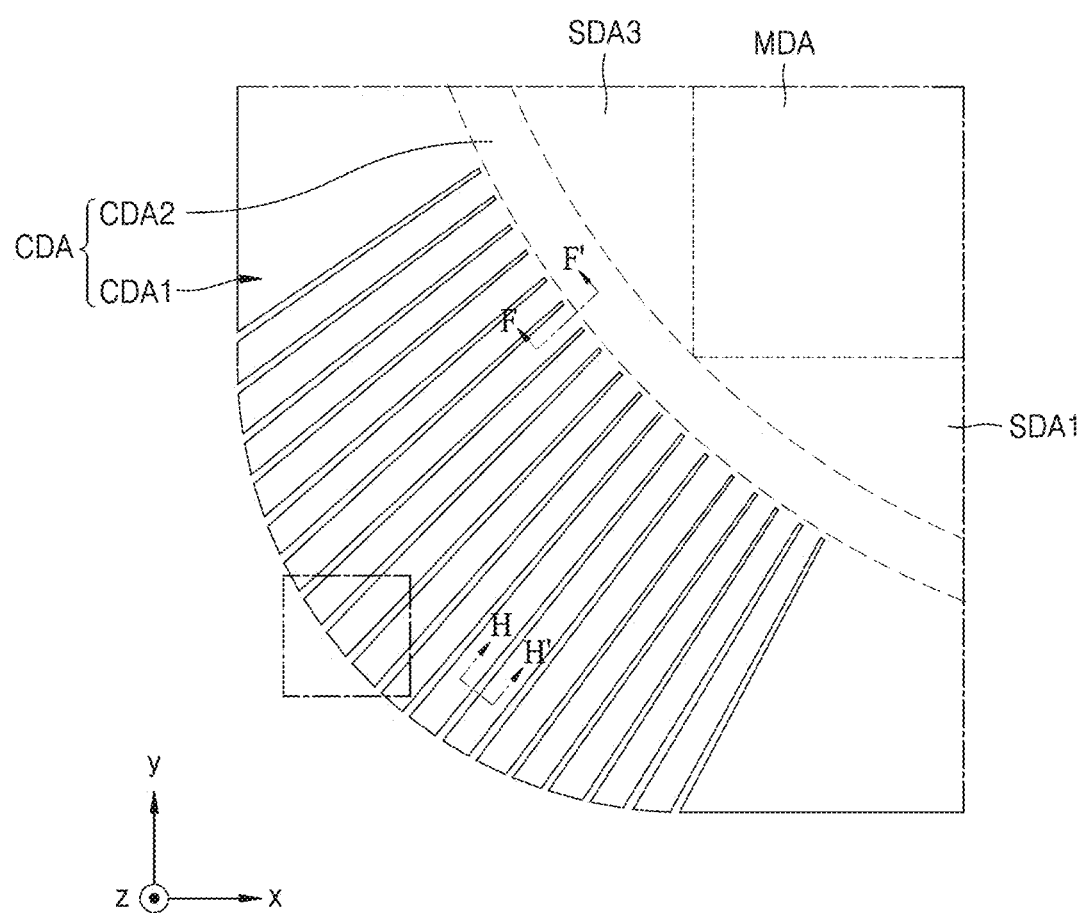
FIG. 9A is a plan view showing part of a display panel according to an embodiment.
Figure 9B:
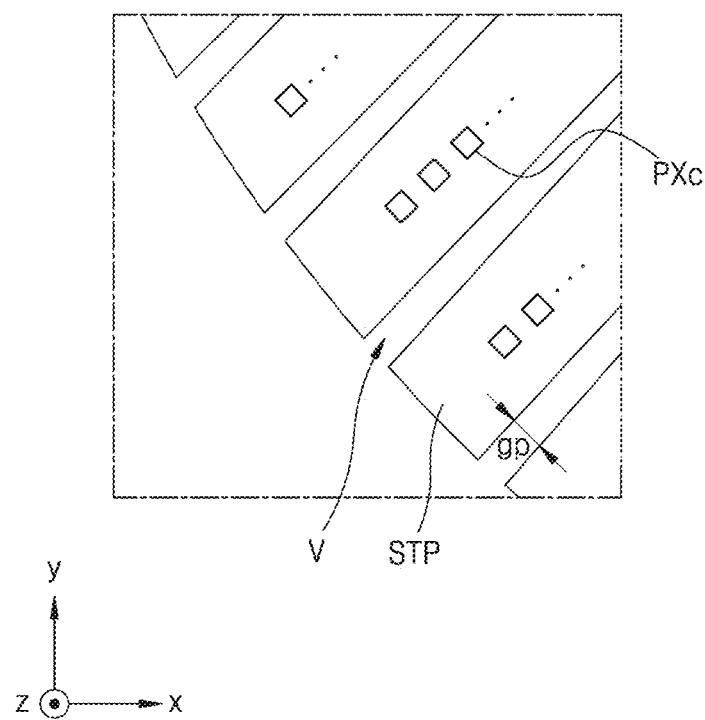
FIG. 9B is an enlarged view of the encircled portion of FIG. 9A.

FIG. 9A is a plan view showing a part of the display panel 10 according to an embodiment, and FIG. 9B is an enlarged view of the encircled portion of FIG. 9A. In detail, the corner display area CDA of the display panel 10 is enlarged and a flat state of the display panel 10 is shown.

Referring to FIGS. 9A and 9B, an embodiment of the display panel 10 may include a plurality of strip portions STP arranged in the corner display area CDA with a plurality of cut portions V therebetween. The plurality of cut portions V are among the plurality of strip portions STP, and may be formed by cutting the substrate 100. The plurality of cut portions V may be defined through the display panel 10.

End portions of the plurality of strip portions STP may be spaced apart from one another with a certain gap gp therebetween. Due to the gap gp, empty spaces are formed among the plurality of strip portions STP, and the empty spaces may correspond to the plurality of cut portions V, respectively. The gaps gp among the plurality of strip portions STP may be variable. In one embodiment, for example, as shown in FIG. 9B, the gaps gp among the plurality of strip portions STP may be widened as being away from the main display area MDA toward the corner display area CDA. In one alternative embodiment, for example, the gaps gp among the plurality of strip portions STP may not be variable, but consistent. In such an embodiment, the plurality of strip portions STP may be arranged radially or may be in parallel with one another.

The plurality of strip portions STP may be connected to one another at a portion adjacent to the main display area MDA. The plurality of strip portions STP may extend from the main display area MDA. An extending length of each of the plurality of strip portions STP may be different from each other. The extending lengths of the plurality of strip portions STP may vary depending on a spaced distance of each of the plurality of strip portions STP from the center of the corner display area CDA. In one embodiment, for example, from among the plurality of strip portions STP, the strip portions STP at the center portion may have longer extending lengths toward the corner display area CDA than those of the other strip portions STP. As the plurality of strip portions STP becomes more away from the center of the corner display area CDA, the extending lengths of the plurality of strip portions STP may be decreased.

In an embodiment, each of the cut portions V may be defined through front and lower surfaces of the display panel 10. Each of the cut portions V may improve flexibility of the display panel 10. In such an embodiment, when an external force (e.g., the force of curving, bending, or pulling the display panel 10) is applied to the display panel 10, shapes of the cut portions V may be changed to reduce generation of the stress generated from the deformation of the display panel 10, and thus, durability of the display panel 10 may be improved.

When the external force is applied to the display panel 10, an area or a shape of the cut portion V may be changed, and a position of the strip portion STP may be also changed. In one embodiment, for example, when a force of bending edges and corners among the edges of the display panel 10, the gaps gp among the plurality of strip portions STP are reduced. Accordingly, areas of the cut portions V may be reduced, and neighboring strip portions STP may come into contact with one another.

In such an embodiment, when the external force is applied to the display panel 10, the gaps gp among the plurality of strip portions STP and the areas of the cut portions V are changed, and shapes of the plurality of strip portions STP may not be changed. Accordingly, even when the external force is applied to the display panel 10, the shapes of the plurality of strip portions STP, on which pixel circuits, display elements, etc. are disposed, are not changed. Thus, the pixel circuits, the display elements, etc. on the plurality of strip portions STP may be protected.

In such an embodiment, where the shapes of the plurality of strip portions STP may not be changed, the corner pixels PXc may be in the corner display area CDA having the curvature in the display panel 10. In such an embodiment, the display area for realizing images may be expanded from the main display area MDA and the side display areas SDA to the corner display areas CDA. The corner pixels PXc on the strip portions STP may be spaced apart from one another in one direction.

Figure 10:
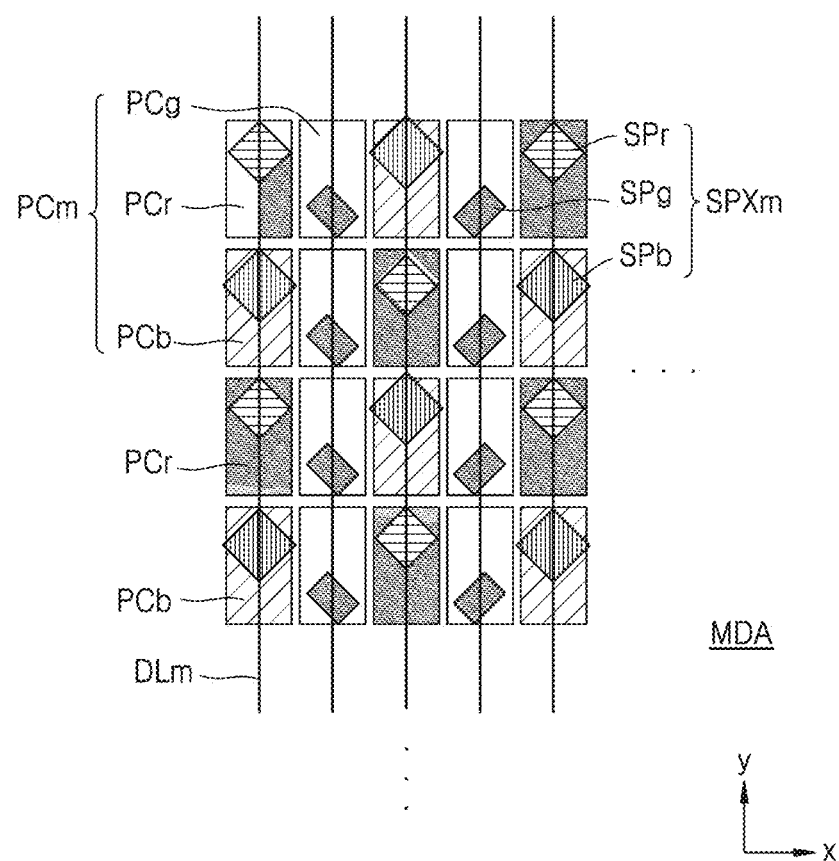
FIG. 10 is a diagram showing a pixel arrangement structure and a pixel circuit arrangement structure in a main display area, according to an embodiment.

FIG. 10 is a diagram showing a pixel arrangement structure, a pixel circuit arrangement structure, and some signal lines in the main display area MDA, according to an embodiment.

Referring to FIG. 10, the main sub-pixels SPXm are in the main display area MDA of the display panel 10, and each of the main sub-pixels SPXm may realize color based on the driving of the main pixel circuit PCm. The main sub-pixels SPXm may include the first sub-pixel SPr, the second sub-pixel SPg, and the third sub-pixel SPb that emit different color light, and the main sub-pixels SPXm may be arranged in the Pentile structure as described above with reference to FIG. 6.

The main pixel circuits PCm may include a first pixel circuit PCr, a second pixel circuit PCg, and a third pixel circuit PCb for respectively driving the first sub-pixel SPr, the second sub-pixel SPg, and the third sub-pixel SPb.

In an embodiment, the main pixel circuits PCm may be arranged in a matrix form in the x-direction and the y-direction. In such an embodiment, the first pixel circuits PCr and the third pixel circuits PCb are alternately arranged in the y-direction, and the second pixel circuits PCg may be arranged in a row in the y-direction.

The main data line DLm configured to transfer the data signals to the main pixel circuits PCm may overlap center portions of the main pixel circuits PCm, and may extend in the y-direction.

Figure 11A:
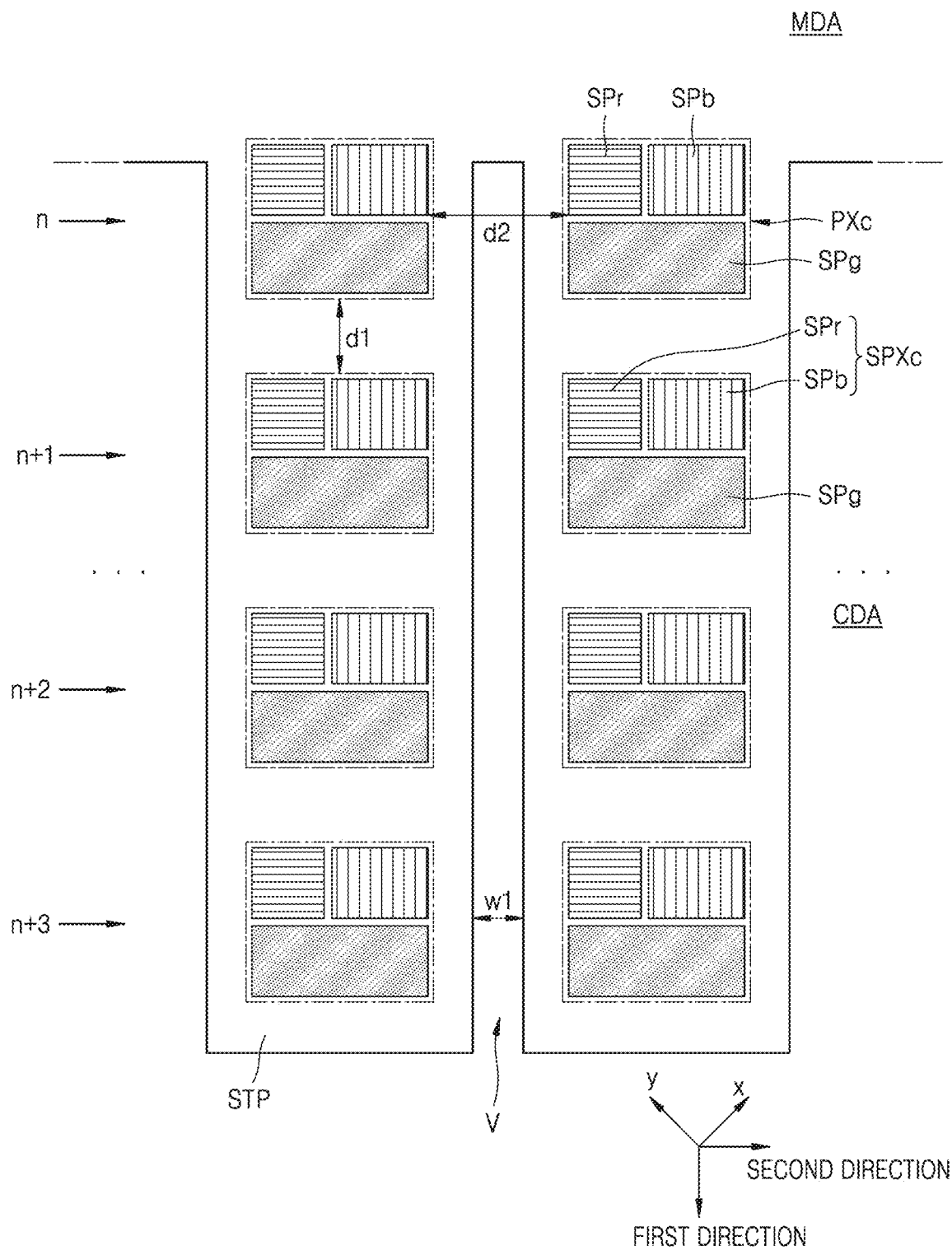
FIG. 11A is a diagram showing a pixel arrangement structure in a corner display area, according to an embodiment.
Figure 11B:
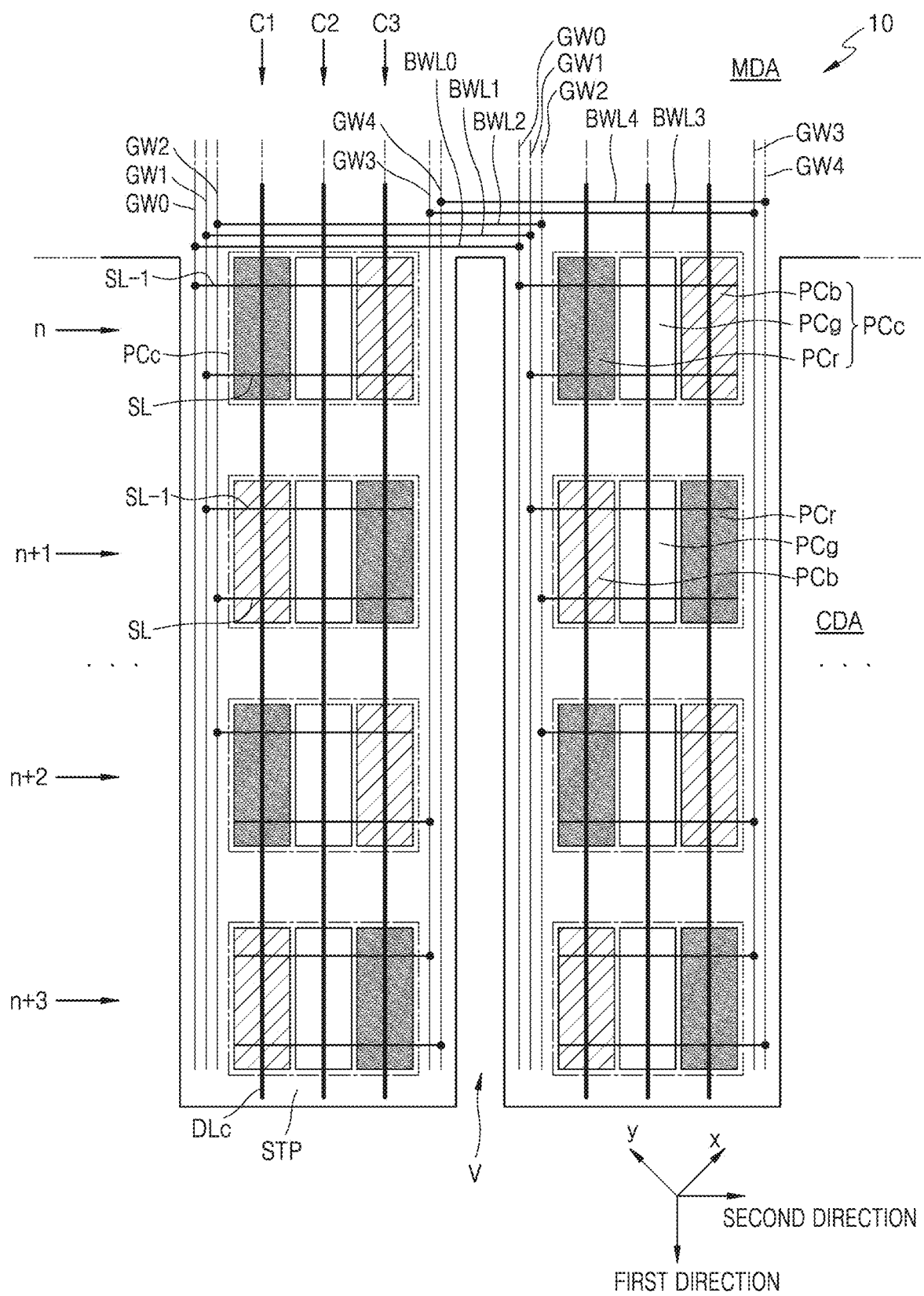
FIGS. 11B and 11C are diagrams showing a pixel circuit arrangement structure and some signal lines in a corner display area, according to an embodiment.

FIG. 11A shows a pixel arrangement structure in the corner display area CDA according to an embodiment, and FIG. 11B shows a pixel circuit arrangement structure and some signal lines in the corner display area CDA according to an embodiment. In detail, FIGS. 11A and 11B show the corner pixels PXc and corner pixel circuits PCc in the strip portions STP of the corner display area CDA.

Referring to FIGS. 11A and 11B, an embodiment of the display panel 10 may include the main display area MDA, and the corner display area CDA including the strip portions STP extending from the main display area MDA and arranged with the cut portions V therebetween.

The strip portions STP may extend from the main display area MDA in a first direction. The first direction may vary depending on the positions of the strip portions STP. The first direction may denote an arbitrary direction between the x-direction and the y-direction. The first direction may denote a long side direction of the strip portion STP. In addition, a second direction crossing the first direction may denote a short side direction of the strip portion STP.

Referring to FIG. 11A, the corner pixels PXc may be spaced apart from one another with a first distance d1 therebetween in the first direction in one strip portion STP. The arrangement of the corner pixels PXc may be set in consideration of a second distance d2 from the corner pixel PXc in an adjacent strip portion STP. In one embodiment, for example, the first distance d1 may be set as a value obtained by subtracting a width w1 of the cut portion in the second direction from the second distance d2. Accordingly, the corner pixels PXc may be evenly arranged in the corner display area CDA.

The corner pixel PXc may include the first sub-pixel SPr, the second sub-pixel SPg, and the third sub-pixel SPb. The first sub-pixel SPr, the second sub-pixel SPg, and the third sub-pixel SPb may respectively denote red pixel, green pixel, and blue pixel. The first sub-pixel SPr, the second sub-pixel SPg, and the third sub-pixel SPb may be arranged in the S-stripe structure as described above with reference to FIG. 7.

In one strip portion STP, sub-pixels in an n-th corner pixel PXc in the first direction and sub-pixels in an (n+1)-th corner pixel PXc in the first direction may be in a same arrangement as each other. Accordingly, the first sub-pixels SPr included in one strip portion STP may be arranged in a row in the first direction. In such an embodiment, the third sub-pixels SPb included in one strip portion STP may be arranged in a row in the first direction. (here, n is a natural number)

Referring to FIG. 11B, corner pixel circuits PCc are spaced apart from each other in one strip portion STP. The corner pixel circuit PCc may include the first pixel circuit PCr, the second pixel circuit PCg, and the third pixel circuit PCb. The first pixel circuit PCr may drive the first sub-pixel SPr, the second pixel circuit PCg may drive the second sub-pixel SPg, and the third pixel circuit PCb may drive the third sub-pixel SPb.

In an embodiment, the pixel circuits included in an n-th corner pixel circuit PCc and the pixel circuits included in an (n+1)-th corner pixel circuit PCc in the first direction in one strip portion STP may be differently arranged.

The pixel circuits included in the n-th corner pixel circuit PCc may include the first pixel circuit PCr, the second pixel circuit PCg, and the third pixel circuit PCb sequentially arranged in the second direction, and the pixel circuits included in the (n+1)-th corner pixel circuit PCc may include the third pixel circuit PCb, the second pixel circuit PCg, and the first pixel circuit PCr sequentially arranged in the second direction.

In such an embodiment, the first pixel circuits PCr and the third pixel circuits PCb in one strip portion STP may be alternately arranged along a first column C1 extending in the first direction. In a second column C2 adjacent to the first column C1, the second pixel circuits PCg may be arranged in a row. In a third column C3 adjacent to the second column C2, the third pixel circuits PCb and the first pixel circuits PCr may be alternately arranged.

Thus, the pixel circuits may be arranged in a same order as that of the pixel circuits in the main display area MDA. In an embodiment where the pixel arrangement structure of the main display area MDA is in the Pentile structure, the main pixel circuits included in the main display area MDA may be arranged in a way such that the first sub-pixel and the third sub-pixel of the main pixel are alternately arranged along the main data line DLm (see FIG. 3) (in the y-direction), and the first pixel circuit and the third pixel circuit driving the first and third sub-pixels may be alternately arranged.

In an embodiment, the pixel circuits in the strip portions STP are arranged in a same order as that of the pixel circuits in the main display area MDA, signals provided to the main display area MDA may be also applied to the corner display area CDA in a same period. In such an embodiment, additional signal lines may not be provided in the corner display area CDA. In such an embodiment, because no additional signal lines are not arranged, a width of the strip portion STP may be optimized.

The corner pixel circuits PCc are arranged from the center portion of the strip portion STP in the first direction, and first to fifth signal lines GW0 to GW4 configured to transfer the scan signals may be arranged at edges of the strip portion STP. The signal lines GW0 to GW4 may extend in the second direction.

The first signal line GW0 is configured to transfer a first scan signal and may be connected to a previous scan line SL−1 of the n-th corner pixel circuit PCc. The second signal line GW1 is configured to transfer a second scan signal and may be connected to the scan line SL of the n-th corner pixel circuit PCc. The previous scan line SL−1 and the scan line SL may extend in the second direction.

The second signal line GW1 is configured to transfer the second scan signal and may be connected to the previous scan line SL−1 of the (n+1)-th corner pixel circuit PCc. The third signal line GW2 is configured to transfer a third scan signal and may be connected to the scan line SL of the (n+1)-th corner pixel circuit PCc.

In such an embodiment, the second signal line GW1 may be shared by the n-th corner pixel circuit PCc and the (n+1)-th corner pixel circuit PCc.

The third signal line GW2 is configured to transfer a third scan signal and may be connected to the previous scan line SL−1 of an (n+2)-th corner pixel circuit PCc. The fourth signal line GW3 is configured to transfer a fourth scan signal and may be connected to the scan line SL of the (n+2)-th corner pixel circuit PCc.

The fourth signal line GW3 is configured to transfer the fourth scan signal and may be connected to the previous scan line SL−1 of an (n+3)-th corner pixel circuit PCc. The fifth signal line GW4 is configured to transfer a fifth scan signal and may be connected to the scan line SL of an (n+4)-th corner pixel circuit PCc.

In such an embodiment, the third signal line GW2 may be shared by the (n+1)-th corner pixel circuit PCc and the (n+2)-th corner pixel circuit PCc, and the fourth signal line GW3 may be shared by the (n+2)-th corner pixel circuit PCc and the (n+3)-th corner pixel circuit PCc.

Each of the first to fifth signal lines GW0 to GW4 may be connected to the signal lines arranged in the adjacent strip portions STP via bridge wires BWL0 to BWL4. The bridge wires BWL0 to BWL4 may extend in the second direction.

In such an embodiment, corner data lines DLc configured to transfer data signals to the pixel circuits in the corner display area CDA may overlap center portions of the pixel circuits. The corner data lines DLc may extend in the lengthwise direction (first direction) of the strip portion. The corner data lines DLc may extend in a same direction as that in which the scan signals configured to transfer the scan signals extend.

In an embodiment, as shown in FIG. 11B, the bridge wires BWL0 to BWL4 connect the lines arranged at right sides of the strip portions STP or lines arranged at left sides of the strip portions STP, but one or more embodiments are not limited thereto.

Figure 11C:
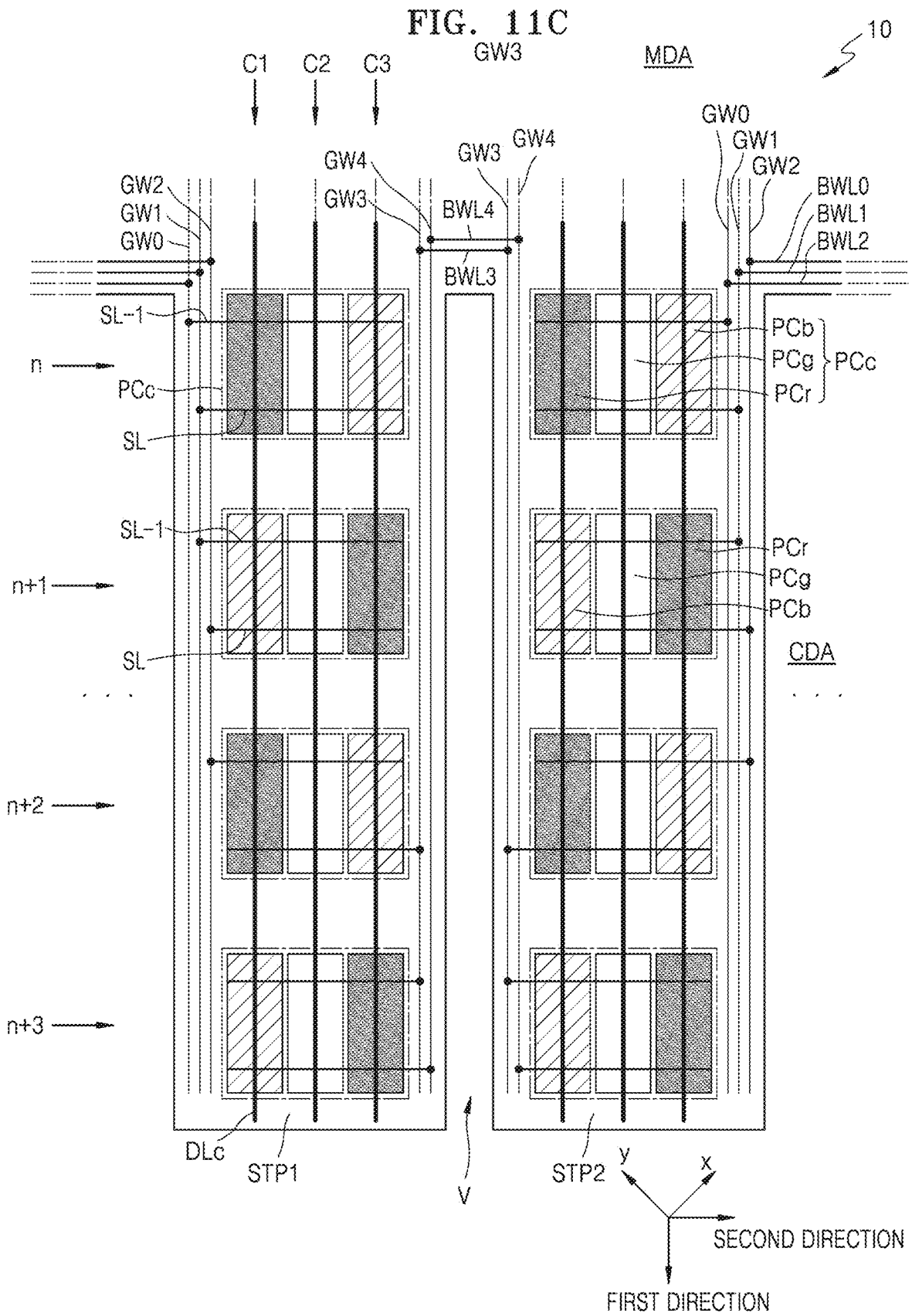

In one alternative embodiment, for example, as shown in FIG. 11C, the bridge wires BWL0 to BWL4 may be designed to connect the lines adjacent to each other in each of the strip portions STP.

Referring to FIG. 11C, in an embodiment, the first signal line GW0, the second signal line GW1, and the third signal line GW2 are arranged at the left side of a first strip portion STP1, and the fourth signal line GW3 and the fifth signal line GW4 may be arranged at the right side of the first strip portion STP1.

The first signal line GW0, the second signal line GW1, and the third signal line GW2 may be at the right side of a second strip portion STP2, and the fourth signal line GW3 and the fifth signal line GW4 may be at the left side of the second strip portion STP2.

In such an embodiment, the fourth signal line GW3 and the fifth signal line GW4 of the first strip portion STP1 are adjacent to the fourth signal line GW3 and the fifth signal line GW4 of the second strip portion STP2, and thus, the fourth bridge wire BWL3 and the fifth bridge wire BWL4 may have reduced lengths.

Figure 12A:
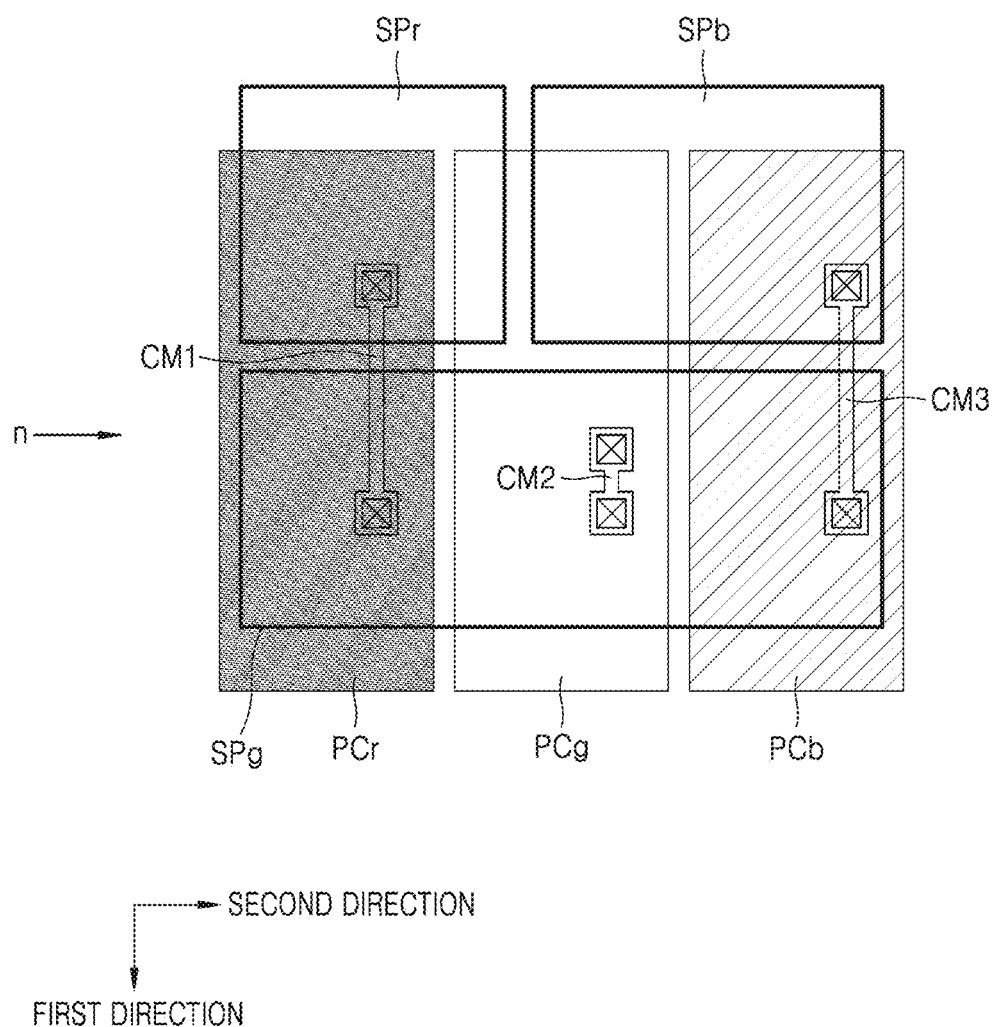
FIGS. 12A and 12B are diagrams showing arrangement relations among pixels and pixel circuits in a corner display area according to an embodiment.
Figure 12B:
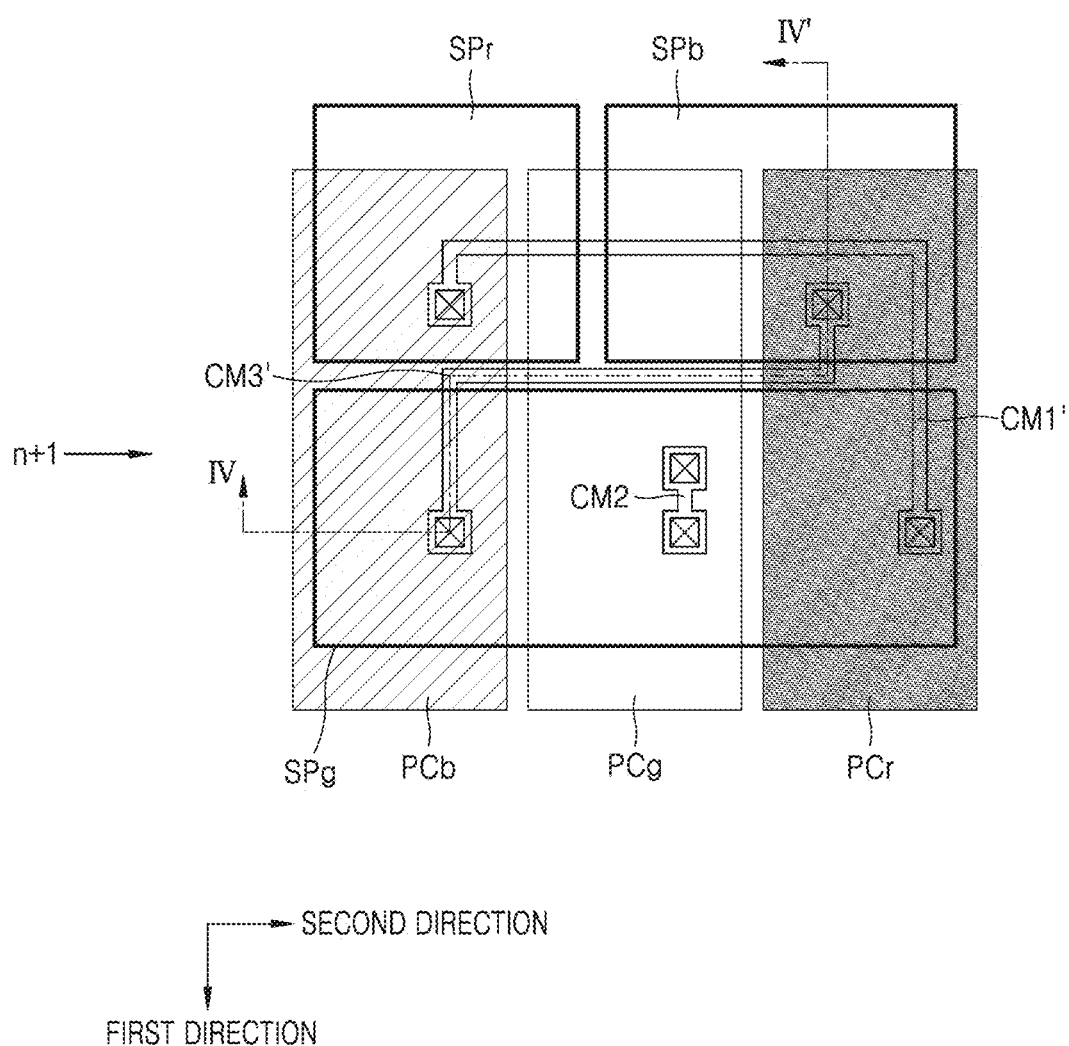

FIGS. 12A and 12B are diagrams showing arrangement relations among pixels and pixel circuits in the corner display area CDA according to an embodiment. In detail, FIG. 12A shows arrangement relationship between the n-th corner pixel PXc and the corner pixel circuit PCc, and FIG. 12B shows arrangement relationship between the (n+1)-th corner pixel PXc and the corner pixel circuit PCc.

Referring to FIG. 12A, in the n-th corner pixel circuit PCc, the first pixel circuit PCr, the second pixel circuit PCg, and the third pixel circuit PCb are sequentially provided in the second direction.

The first sub-pixel SPr may overlap the first pixel circuit PCr. The display element realizing the first sub-pixel SPr may be connected to the first pixel circuit PCr via a first connecting electrode CM1.

The second sub-pixel SPg may overlap the first pixel circuit PCr, the second pixel circuit PCg, and the third pixel circuit PCb. The display element realizing the second sub-pixel SPg may be connected to the second pixel circuit PCg via a second connecting electrode CM2.

The third sub-pixel SPb may overlap the third pixel circuit PCb. The display element realizing the third sub-pixel SPb may be connected to the third pixel circuit PCb via a third connecting electrode CM3.

Referring to FIG. 12B, in the (n+1)-th corner pixel circuit PCc, the third pixel circuit PCb, the second pixel circuit PCg, and the first pixel circuit PCr are sequentially provided in the second direction.

The first sub-pixel SPr may overlap the third pixel circuit PCb. The display element realizing the first sub-pixel SPr may be connected to the first pixel circuit PCr via a first connecting electrode CM1'. The first connecting electrode CM1' may extend across the upper portion of the second pixel circuit PCg. The first connecting electrode CM1' may overlap the first pixel circuit PCr, the second pixel circuit PCg, and the third pixel circuit PCb.

The second sub-pixel SPg may overlap the first pixel circuit PCr, the second pixel circuit PCg, and the third pixel circuit PCb. The display element realizing the second sub-pixel SPg may be connected to the second pixel circuit PCg via a second connecting electrode CM2.

The third sub-pixel SPb may overlap the first pixel circuit PCr. The display element realizing the third sub-pixel SPb may be connected to the first pixel circuit PCr via a third connecting electrode CM3'. The third connecting electrode CM3' may extend across the upper portion of the second pixel circuit PCg. The third connecting electrode CM3' may overlap the first pixel circuit PCr, the second pixel circuit PCg, and the third pixel circuit PCb.

Figure 13:
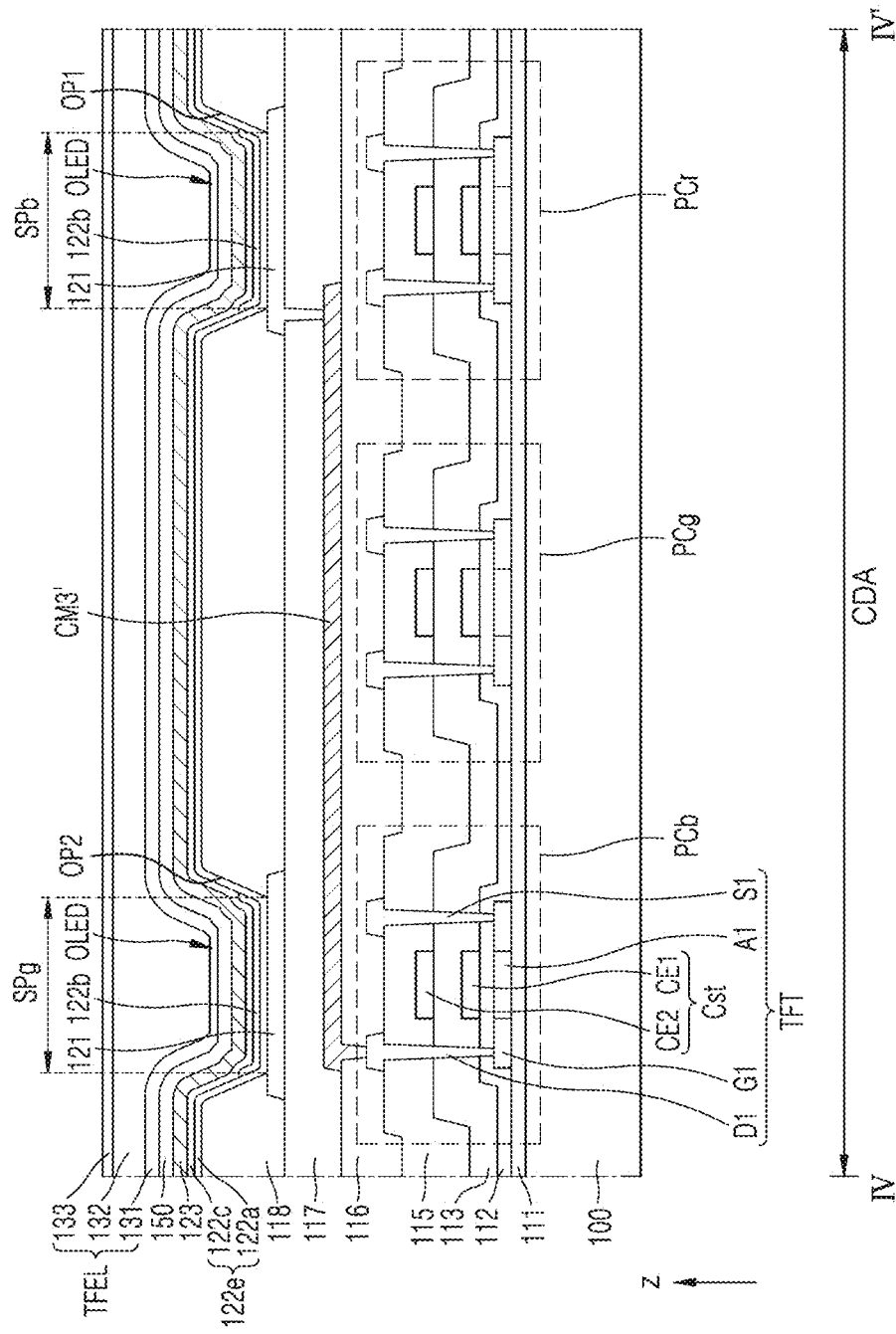
FIG. 13 is a cross-sectional view of the display panel taken along line IV-IV' of FIG. 12B.

FIG. 13 is a cross-sectional view of the display panel taken along line IV-IV' of FIG. 12B. In FIG. 13, the same or like reference numerals as those of FIG. 5 denote the same or like elements, and any repetitive detailed descriptions thereof will be omitted or simplified.

Referring to FIG. 13, an embodiment of the display panel 10 may include the substrate 100, the first to third pixel circuits PCr, PCg, and PCb on the substrate 100, and organic light-emitting diodes OLED included in the sub-pixels SPg and SPb.

In a partial corner display area CDA, the first pixel circuit PCr may overlap the third sub-pixel SPb and may not overlap the first sub-pixel. In such an embodiment, the third pixel circuit PCb may not overlap the third sub-pixel SPb. Accordingly, the third pixel circuit PCb may be connected to the organic light-emitting diode OLED included in the third sub-pixel SPb via the third connecting electrode CM3'.

The third connecting electrode CM3' is on the first organic insulating layer 116, and an end of the third connecting electrode CM3' may be connected to the third pixel circuit PCb via a contact hole defined in the first organic insulating layer 116. The other end of the third connecting electrode CM3' may be connected to the pixel electrode 121 of the organic light-emitting diode OLED included in the third sub-pixel SPb. The second organic insulating layer 117 is between the third connecting electrode CM3' and the pixel electrode 121, and the pixel electrode 121 may be connected to the third connecting electrode CM3' via a contact hole defined in the second organic insulating layer 117. The third connecting electrode CM3' may overlap the second pixel circuit PCg.

Figure 14A:
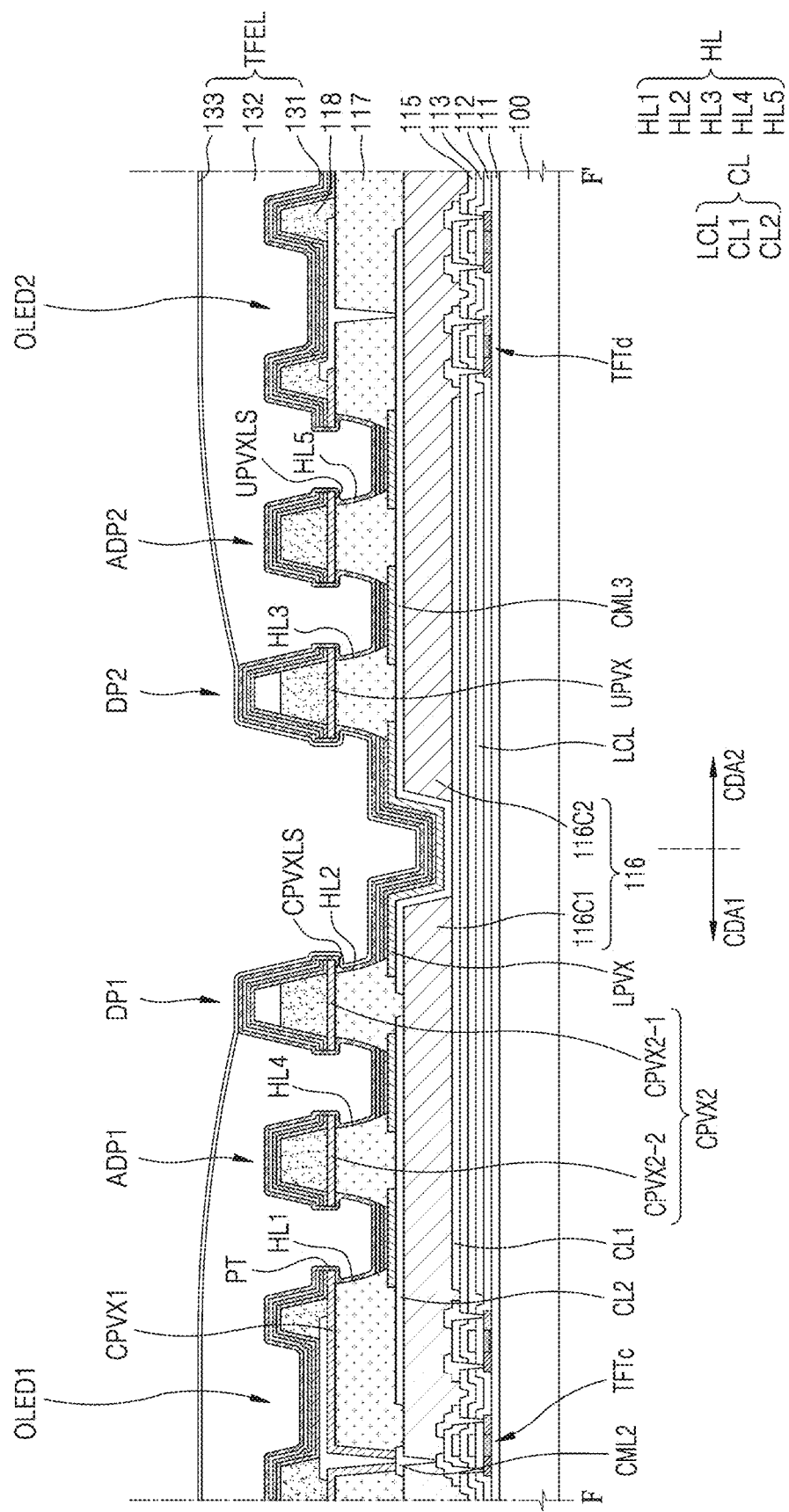
FIG. 14A is a cross-sectional view of the display panel taken along line F-F' of FIG. 9A.
Figure 14B:
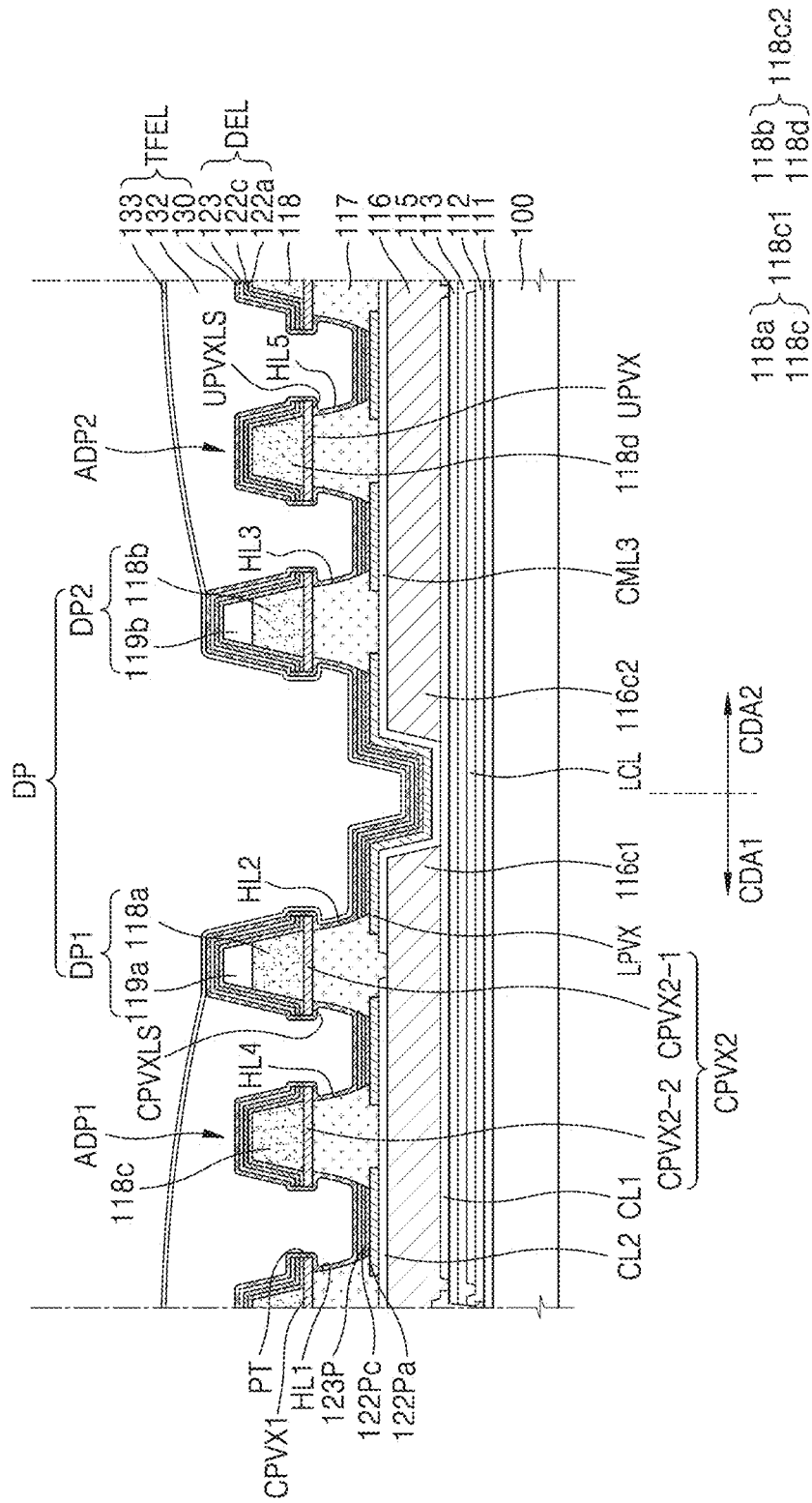
FIG. 14B is an enlarged view of a dam portion of FIG. 14A.
Figure 15:
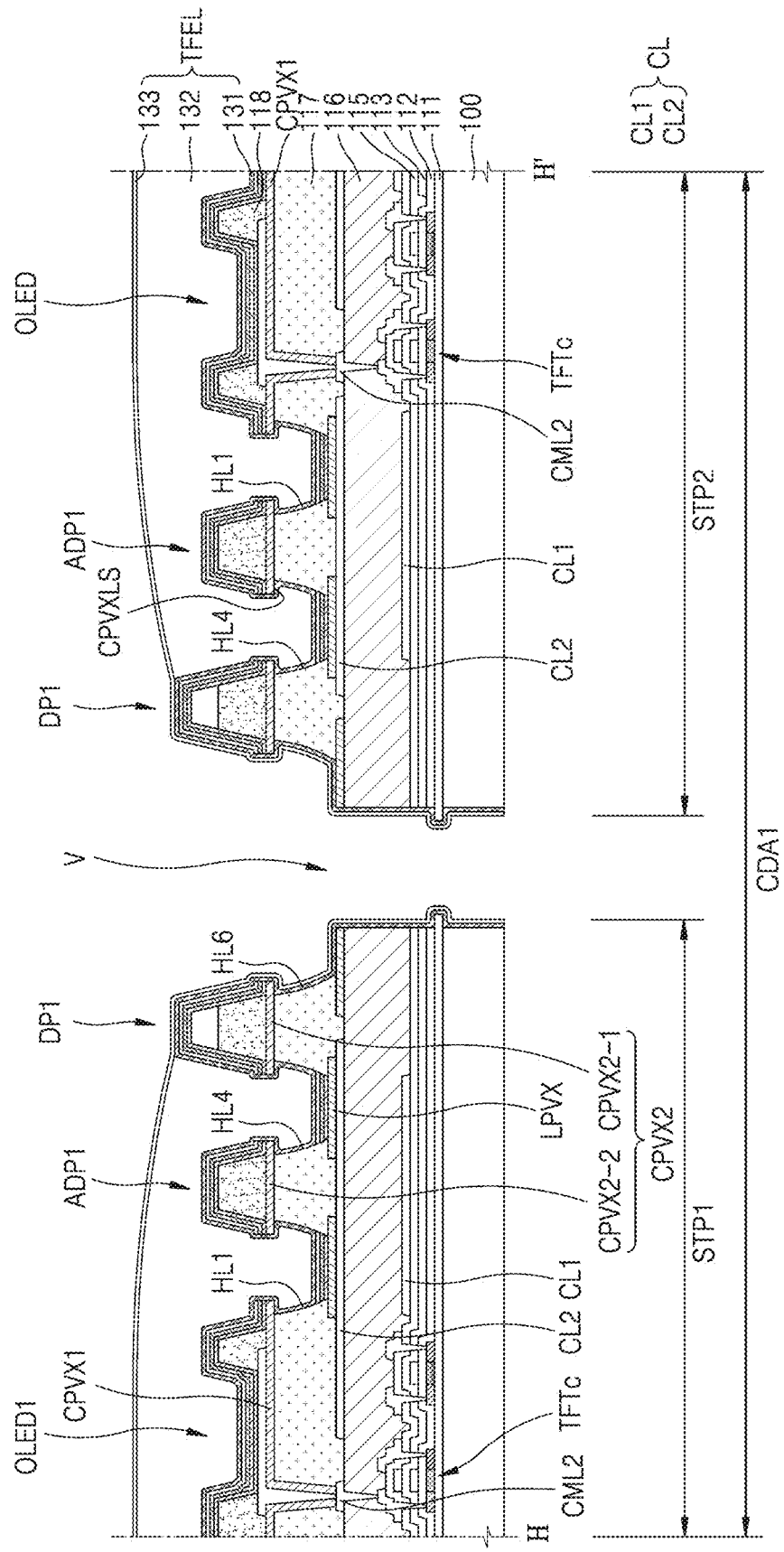
FIG. 15 is a cross-sectional view of the display panel taken along line H-H' of FIG. 9A.

FIG. 14A is a cross-sectional view of the display panel taken along line F-F' of FIG. 9A. FIG. 14B is an enlarged view of a dam portion DP of FIG. 14A. FIG. 15 is a cross-sectional view of the display panel taken along line H-H' of FIG. 9A. In FIGS. 14A to 15, the same or like reference numerals as those of FIG. 5 denote the same or like elements, and thus, any repetitive detailed descriptions thereof will be omitted or simplified.

Referring to FIGS. 14A and 14B, an embodiment of the display panel may include the first corner display area CDA1 and the second corner display area CDA2. A corner thin film transistor TFTc and a first corner organic light-emitting diode OLED1 may be in the first corner display area CDA1, and a second corner organic light-emitting diode OLED2 may be in the second corner display area CDA2. The corner organic light-emitting diode TFTc and the first corner organic light-emitting diode OLED1 implement a sub-pixel in the first corner display area CDA1, and the second corner organic light-emitting diode OLED2 may implement a sub-pixel in the second corner display area CDA2.

One of the second corner organic light-emitting diodes OLED2 may be close to the edge of the second corner display area CDA2, and may face the first corner organic light-emitting diode OLED1.

The connecting lines CL may be on the substrate 100, where the first corner display area CDA1 and the second corner display area CDA2 are arranged. The connecting lines CL may include a lower connecting line LCL, a first connecting line CL1, and a second connecting line CL2.

In an embodiment, the lower connecting line LCL may be between the first gate insulating layer 112 and the second gate insulating layer 113. In an alternative embodiment, the lower connecting line LCL may be between the second gate insulating layer 113 and the interlayer insulating layer 115. In such an embodiment, the lower connecting line LCL may include a same material as that of one of the first gate electrode G1 and the upper electrode CE2 shown in FIG. 5. In another alternative embodiment, the lower connecting line LCL may be between the buffer layer 111 and the first gate insulating layer 112. In such an embodiment, the lower connecting line LCL may include a same material as that of the first semiconductor layer A1 of FIG. 5.

The lower connecting line LCL may be connected from the second corner display area CDA2 to the first corner display area CDA1. The lower connecting line LCL may be a signal line for providing an electrical signal to the first corner organic light-emitting diode OLED1, or may be a power line for providing power.

The first connecting line CL1 may be on the interlayer insulating layer 115, and the first organic insulating layer 116 may be on the first connecting line CL1. The first organic insulating layer 116 may be separated into a first corner insulating layer 116C1 and a second corner insulating layer 116C2, based on a second hole HL2. The first corner insulating layer 116C1 may cover the corner thin film transistor TFTc, and the second corner insulating layer 116C2 may cover a driving circuit thin film transistor TFTd. In an embodiment, the first connecting line CL1 may be partially exposed between the first corner insulating layer 116C1 and the second corner insulating layer 116C2.

The second connecting line CL2, the second connecting electrode CML2, and the third connecting electrode CML3 may be on the first organic insulating layer 116. The second connecting electrode CML2 may be on the first corner insulating layer 116C1. In an embodiment, the third connecting electrode CML3 may be a part of the second connecting line CL2.

The third connecting electrode CML3 may be on the second corner insulating layer 116C2. In an embodiment, the third connecting electrode CML3 may be connected to the first connecting line CL1. In such an embodiment, the third connecting electrode CML3 may extend from the second corner insulating layer 116C2 to the first corner insulating layer 116C1, and may cover a side surface of the second corner insulating layer 116C2 and a side surface of the first corner insulating layer 116C1. In such an embodiment, the third connecting electrode CML3 may be connected to the first connecting line CL1 that is exposed between the first corner insulating layer 116C1 and the second corner insulating layer 116C2. Therefore, the first connecting line CL1 and the third connecting electrode CML3 may prevent external moisture from infiltrating into the first corner organic light-emitting diode OLED1 or the second corner organic light-emitting diode OLED2.

A lower inorganic pattern layer LPVX may be on the second connecting line CL2 and the third connecting electrode CML3. In an embodiment, a plurality of lower inorganic pattern layers LPVX may be on the second connecting line CL2 and/or the third connecting electrode CML3, and the plurality of lower inorganic pattern layers LPVX may be spaced apart from one another on the second connecting line CL2 and/or the third connecting electrode CML3. In an embodiment, one of the plurality of lower inorganic pattern layers LPVX may cover the side surface of the second corner insulating layer 116C2 and the side surface of the first corner insulating layer 116C1, which face each other.

The second organic insulating layer 117 may cover the second connecting line CL2, the second connecting electrode CML2, and the third connecting electrode CML3. In such an embodiment, the second organic insulating layer 117 may cover edges of the lower inorganic pattern layer LPVX.

A plurality of holes HL may be defined in the second organic insulating layer 117 to expose a part of the lower inorganic pattern layer LPVX. The second organic insulating layer 117 may include a plurality of holes HL. In an embodiment, the holes HL may include first to fifth holes HL1, HL2, HL3, HL4, and HL5. The first hole HL1 and the fourth hole HL4 may overlap the first corner display area CDA1. The third hole HL3 and the fifth hole HL5 may overlap the second corner display area CDA2. The second hole HL2 may be between the third hole HL3 and the fourth hole HL4.

The holes HL in the second organic insulating layer 117 may be formed through an etching process. If the lower inorganic pattern layer LPVX is omitted, the second connecting line CL2 may be over-etched due to the etching process. In this case, a resistance of the second connecting line CL2 may be increased. In an embodiment, the lower inorganic pattern layer LPVX is provided on the second connecting line CL2 to overlap the holes HL in the second organic insulating layer 117, such that over-etching of the second connecting line CL2 may be prevented.

A corner inorganic pattern layer CPVX and an upper inorganic pattern layer UPVX may be on the second organic insulating layer 117. The corner inorganic pattern layer CPVX may overlap the first corner display area CDA1. The upper inorganic pattern layer UPVX may overlap the second corner display area CDA2. The upper inorganic pattern layer UPVX may extend between the first corner display area CDA1 and the main display area.

The corner inorganic pattern layer CPVX may include a first corner inorganic pattern layer CPVX1 and a second corner inorganic pattern layer CPVX2. In an embodiment, the first corner inorganic pattern layer CPVX1 may be between the first corner organic light-emitting diode OLED1 and the second organic insulating layer 117. The first corner inorganic pattern layer CPVX1 may be between a pixel electrode of the first corner organic light-emitting diode OLED1 and the second organic insulating layer 117. The second corner inorganic pattern layer CPVX2 may be spaced apart from the first corner inorganic pattern layer CPVX1 on the second organic insulating layer 117 with the holes HL therebetween. In one embodiment, for example, the second corner inorganic pattern layer CPVX2 may be spaced apart from the first corner inorganic pattern layer CPVX1 with the first hole HL1 therebetween.

In an embodiment, the second corner inorganic pattern layer CPVX2 may include an external inorganic pattern layer CPVX2-1 and an internal inorganic pattern layer CPVX2-2. The external inorganic pattern layer CPVX2-1 and the internal inorganic pattern layer CPVX2-2 may be spaced apart from each other. The external inorganic pattern layer CPVX2-1 may be farther from the first corner organic light-emitting diode OLED1 than the internal inorganic pattern layer CPVX2-2. In an embodiment, the external inorganic pattern layer CPVX2-1 may overlap a first dam portion DP1. The internal inorganic pattern layer CPVX2-2 may overlap a first auxiliary dam portion ADP1.

The corner inorganic pattern layer CPVX and the upper inorganic pattern layer UPVX may each include a protruding tip PT that protrudes toward a center of the hole HL. The center direction of the hole HL may denote a direction from the internal surface of the second organic insulating layer 117, which defines the hole HL, to a center axis of the hole HL. Therefore, a lower surface of the protruding tip TP may be exposed in the hole HL. In such an embodiment, the hole HL of the second organic insulating layer 117 may have an undercut structure.

In an embodiment, the upper inorganic pattern layer UPVX and the internal inorganic pattern layer CPVX2-2 may each include a protruding tip that protrudes toward a center of a first hole HL1. In an embodiment, the internal inorganic pattern layer CPVX2-2 and the external inorganic pattern layer CPVX2-1 may each have a protruding tip that protrudes toward a center of the fourth hole HL4. In such an embodiment, the hole HL of the second organic insulating layer 117 may have an undercut structure. At least one of a lower surface CPVXLS of the corner inorganic pattern layer CPVX and a lower surface UPVXLS of the upper inorganic pattern layer UPVX may overlap the hole HL of the second organic insulating layer 117.

The dam portion DP may protrude from an upper surface of the upper inorganic pattern layer UPVX in the thickness direction of the substrate 100. The dam portion DP may include a first dam portion DP1 and a second dam portion DP2 that are spaced apart from each other. The dam portion DP and the hole HL may be alternately provided.

A first corner organic pattern layer 118c1 may be on the corner inorganic pattern layer CPVX. The first corner organic pattern layer 118C1 may include the same material as that of the pixel defining layer 118. The first corner organic pattern layer 118C1 may be simultaneously formed with the pixel defining layer 118 in a same process.

The first corner organic pattern layer 118C1 may include a first sub-organic pattern layer 118a and a third sub-organic pattern layer 118c that are spaced apart from each other. The first sub-organic pattern layer 118a may be on the external inorganic pattern layer CPVX2-1. The third sub-organic pattern layer 118c may be on the internal inorganic pattern layer CPVX2-2.

A second corner organic pattern layer 118c2 may be on the upper inorganic pattern layer UPVX. The second corner organic pattern layer 118C2 may include the same material as that of the pixel defining layer 118. The second corner organic pattern layer 118C2 may be simultaneously formed with the pixel defining layer 118 in a same process.

The second corner organic pattern layer 118C2 may include a second sub-organic pattern layer 118b and a fourth sub-organic pattern layer 118d that are spaced apart from each other. The second sub-organic pattern layer 118b and the fourth sub-organic pattern layer 118d may be on the upper inorganic pattern layer UPVX.

A first upper organic pattern layer 119a may be on the first sub-organic pattern layer 118a. The first sub-organic pattern layer 118a and the first upper organic pattern layer 119a may form or collectively define the first dam portion DP1.

A second upper organic pattern layer 119b may be on the second sub-organic pattern layer 118b. The second sub-organic pattern layer 118b and the second upper organic pattern layer 119b may form or collectively define the second dam portion DP2.

The first functional layer 122a, the second functional layer 122c, and the opposite electrode 123 on the corner inorganic pattern layer CPVX and the upper inorganic pattern layer UPVX may be disconnected by the hole HL and the pair of protruding tips PT. In such an embodiment, a first functional layer pattern 122Pa, a second functional layer pattern 122Pc, and an opposite electrode pattern 123P may be in the hole HL. In an embodiment, at least one of the lower surface CPVXLS of the corner inorganic pattern layer CPVX and the lower surface UPVXLS of the upper inorganic pattern layer UPVX, which overlap the hole HL, may not be in contact with the first functional layer 122a, the second functional layer 122c, and the opposite electrode 123.

A first auxiliary dam portion ADP1 may be between the first corner organic light-emitting diode OLED1 and the first dam portion DP1. The first auxiliary dam portion ADP1 may be between the first hole HL1 and the fourth hole HL4. The first auxiliary dam portion ADP1 may include the third sub-organic pattern layer 118c. A second auxiliary dam portion ADP2 may be between the second corner organic light-emitting diode OLED2 and the second dam portion DP2. The second auxiliary dam portion ADP2 may be between the third hole HL3 and the fifth hole HL5. The second auxiliary dam portion ADP2 may include the fourth sub-organic pattern layer 118d.

In an embodiment, a thickness of the dam portion DP may be greater than that of the first auxiliary dam portion ADP1. In such an embodiment, the thickness of the dam portion DP may be greater than that of the second auxiliary dam portion ADP2. In one embodiment, for example, the first dam portion DP1 includes the first sub-organic pattern layer 118a and the first upper organic pattern layer 119a, but the first auxiliary dam portion ADP1 includes the third sub-organic pattern layer 118c. Thus, the first dam portion DP1 and the first auxiliary dam portion ADP1 may have different thickness from each other. The thickness of the first dam portion DP1 may correspond to a distance from an upper surface of the external inorganic pattern layer CPVX2-1 to an upper surface of the first upper organic pattern layer 119a. The thickness of the first auxiliary dam portion ADP1 may correspond to a distance from an upper surface of the internal inorganic pattern layer CPVX2-2 to an upper surface of the third sub-organic pattern layer 118c.

In an embodiment, the distance from the upper surface of the substrate 100 to the upper surface of the first upper organic pattern layer 119a may be greater than that from the upper surface of the substrate 100 to the upper surface of the third sub-organic pattern layer 118c. In such an embodiment, the distance from the upper surface of the substrate 100 to the upper surface of the second upper organic pattern layer 119b may be greater than that from the upper surface of the substrate 100 to the upper surface of the fourth sub-organic pattern layer 118d.

In an embodiment, the first auxiliary dam portion ADP1 and the second auxiliary dam portion ADP2 may be between the organic light-emitting diode and the dam portion DP. In such an embodiment, the thickness of the first auxiliary dam portion ADP1 and the thickness of the second auxiliary dam portion ADP2 are less than that of the dam portion DP, such that the first and second auxiliary dam portions ADP1 and ADP2 may not be in contact with a mask sheet. Therefore, a first inorganic encapsulation layer 131 may be on a flat upper surface of the first auxiliary dam portion ADP1 and an upper surface of the second auxiliary dam portion ADP2. Accordingly, a time for external air or moisture from outside to reach the organic light-emitting diode may be delayed, and a barrier characteristic of the first inorganic encapsulation layer 131 may be strengthened.

In an embodiment, the first auxiliary dam portion ADP1 and the second auxiliary dam portion ADP2 may each have a same thickness as that of the dam portion DP.

The thin film encapsulation layer TFEL may cover the first corner organic light-emitting diode OLED1 and the second corner organic light-emitting diode OLED2. The thin film encapsulation layer TFEL may include at least one inorganic encapsulation layer and at least one organic encapsulation layer. FIGS. 14A and 14B show an embodiment where the thin film encapsulation layer TFEL includes the first inorganic encapsulation layer 131, an organic encapsulation layer 132, and a second inorganic encapsulation layer 133.

The thin film encapsulation layer TFEL may extend from the first corner organic light-emitting diode OLED1 to the first dam portion DP1. Also, the thin film encapsulation layer TFEL may extend from the second corner organic light-emitting diode OLED2 to the second dam portion DP2.

The first inorganic encapsulation layer 131 may entirely and continuously cover the first corner display area CDA1 and the second corner display area CDA2. In such an embodiment, the first inorganic encapsulation layer 131 may be entirely and continuously arranged throughout the first hole HL1, the first auxiliary dam portion ADP1, the fourth hole HL4, the first dam portion DP1, the second hole HL2, the second dam portion DP2, the third hole HL3, the second auxiliary dam portion ADP2, and the fifth hole HL5. In such an embodiment, the first inorganic encapsulation layer 131 may cover the first functional layer pattern 122Pa, the second functional layer pattern 122Pc, and the opposite electrode pattern 123P arranged in the holes HL.

The first inorganic encapsulation layer 131 may be in contact with the upper inorganic pattern layer UPVX and the corner inorganic pattern layer CPVX. In such an embodiment, the first inorganic encapsulation layer 131 may be in contact with the protruding tips of the upper inorganic pattern layer UPVX and the corner inorganic pattern layer CPVX. The first inorganic encapsulation layer 131 may be in contact with the lower surface UPVXLS of the upper inorganic pattern layer UPVX overlapping the holes HL of the second organic insulating layer 117 and the lower surface CPVXLS of the corner inorganic pattern layer CPVX overlapping the holes HL in the second organic insulating layer 117.

The organic encapsulation layer 132 may be disconnected by the dam portions DP. In one embodiment, for example, the organic encapsulation layer 132 may extend from the first corner organic light-emitting diode OLED1 to the first dam portion DP1 and may overlap the first hole HL1 and/or the fourth hole HL4. In such an embodiment, the organic encapsulation layer 132 may extend from the second corner organic light-emitting diode OLED2 to the second dam portion DP2 and may overlap the third hole HL3 and/or the fifth hole HL5. In such an embodiment, the organic encapsulation layer 132 may be controlled by the first dam portion DP1 and the second dam portion DP2. In such an embodiment, the second hole HL2 may be spaced apart from the organic encapsulation layer 132.

The second inorganic encapsulation layer 133 may entirely and continuously cover the first corner display area CDA1 and the second corner display area CDA2, like the first inorganic encapsulation layer 131. In an embodiment, the second inorganic encapsulation layer 133 may be in contact with the first inorganic encapsulation layer 131 on the first dam portion DP1 and the second dam portion DP2. In such an embodiment, the second inorganic encapsulation layer 133 may be in contact with the first inorganic encapsulation layer 131 in the second hole HL2. Therefore, the organic encapsulation layer 132 may be disconnected by the dam portions DP.

Referring to FIG. 15, the corner thin film transistor TFTc, the first corner organic light-emitting diode OLED1, and the thin film encapsulation layer TFEL may be in each of the first strip portion STP1 and the second strip portion STP2.

The first hole HL1 and the fourth hole HL4 may respectively overlap the first strip portion STP1 and the second strip portion STP2. The first auxiliary dam portion ADP1 may be between the first hole HL1 and the fourth hole HL4, and the first dam portion DP1 may be between the fourth hole HL4 and the cut portions V (or a sixth hole HL6).

The first strip portion STP1 and the second strip portion STP2 may be spaced apart from each other with the cut portion V therebetween in the first corner display area CDA1. The inorganic insulating layer IIL, the first organic insulating layer 116, the second organic insulating layer 117, and the thin film encapsulation layer TFEL may be disconnected based on the cut portion V.

In embodiments of the invention, as described above, the display panel and the display apparatus include the corner display area to expand the region of displaying images.

In such embodiment of the display panel and the display apparatus, the pixel circuits in the corner display area may be optimally arranged, and thus, the number of lines in the corner display area may be reduced and the space may be ensured.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a substrate including a main display area and a corner display area, wherein the corner display area extends from a corner of the main display area and includes a strip portion between cut portions;
   main pixels on the substrate in the main display area;
   main pixel circuits on the substrate in the main display area, wherein the main pixel circuits drive the main pixels; and
   corner pixels on the substrate in the strip portion; and
   corner pixel circuits on the substrate in the strip portion, wherein the corner pixel circuits drive the corner pixels,
   wherein
   each of the corner pixels includes a first sub-pixel, a second sub-pixel, and a third sub-pixel,
   each of the corner pixel circuits includes a first pixel circuit which drives the first sub-pixel, a second pixel circuit which drives the second sub-pixel, and a third pixel circuit which drives the third sub-pixel, and
   an arrangement of the first pixel circuit, the second pixel circuit and the third pixel circuit in an n-th corner pixel circuit in a first direction which is a lengthwise direction of the strip portion is different from an arrangement of the first pixel circuit, the second pixel circuit and the third pixel circuit in an (n+1)-th corner pixel circuit in the first direction, wherein n is a natural number.

2. The display panel of claim 1, wherein
   the first pixel circuits and the third pixel circuits are alternately arranged in a first column which extends in the first direction, and
   the second pixel circuits are arranged in a second column which is adjacent to the first column.

3. The display panel of claim 1, wherein
   the first pixel circuit of the n-th corner pixel circuit overlaps the first sub-pixel, and
   the first pixel circuit of the (n+1)-th corner pixel circuit overlaps the third sub-pixel.

4. The display panel of claim 1, wherein an arrangement of the main pixels is different from an arrangement of the corner pixels.

5. The display panel of claim 4, wherein
   the main pixels are arranged in a Pentile pixel arrangement structure, and
   the corner pixels are arranged in an S-stripe structure.

6. The display panel of claim 1, wherein
   the corner pixel circuits are in a center portion of the strip portion, and
   signal lines extending in the first direction are at edges of the strip portion.

7. The display panel of claim 6, wherein
   the signal lines transfers scan signals, and
   some of the signal lines are connected to the n-th corner pixel circuit and the (n+1)-th corner pixel circuit.

8. The display panel of claim 6, wherein a corner data line, which transfers data signals to the corner pixel circuits, overlaps the corner pixel circuits and extends in the first direction.

9. The display panel of claim 1, wherein
   the corner display area includes a first corner display area and a second corner display area,
   the strip portion is in the first corner display area, and
   a scan driving circuit is in the second corner display area.

10. The display panel of claim 9, wherein the corner pixels in the second corner display area at least partially overlap the scan driving circuit.

11. A display apparatus comprising:
    a display panel including a main display area and a corner display area, wherein the corner display area extends from a corner of the main display area and is curved with a preset radius of curvature; and
    a cover window covering the display panel and having a shape corresponding to a shape of the display panel,
    wherein the corner display area includes a strip portion between cut portions,
    the strip portion includes corner pixels and corner pixel circuits which drive the corner pixels, each of the corner pixels include a first sub-pixel, a second sub-pixel, and a third sub-pixel, each of the corner pixel circuits includes a first pixel circuit which drives the first sub-pixel, a second pixel circuit which drives the second sub-pixel, and a third pixel circuit which drives the third sub-pixel, and an arrangement of the first pixel circuit, the second pixel circuit and the third pixel circuit in an n-th corner pixel circuit in a first direction, which is a lengthwise direction of the strip portion, is different from an arrangement of the first pixel circuit, the second pixel circuit and the third pixel circuit in an (n+1)-th corner pixel circuit in the first direction, wherein n is a natural number.

12. The display apparatus of claim 11, wherein the first pixel circuits and the third pixel circuits are alternately arranged in a first column which extends in the first direction, and the second pixel circuits are arranged in a second column which is adjacent to the first column.

13. The display apparatus of claim 11, wherein the first pixel circuit of the n-th corner pixel circuit overlaps the first sub-pixel, and the first pixel circuit of the (n+1)-th corner pixel circuit overlaps the third sub-pixel.

14. The display apparatus of claim 11, wherein the main display area includes main pixels and main pixel circuits which drives the main pixels, and an arrangement of the main pixels is different from an arrangement of the corner pixels.

15. The display apparatus of claim 14, wherein the main pixels are arranged in a Pentile pixel arrangement structure, and the corner pixels are arranged in an S-stripe structure.

16. The display apparatus of claim 11, wherein the corner pixel circuits are in a center portion of the strip portion, and signal lines extending in the first direction are at edges of the strip portion.

17. The display apparatus of claim 16, wherein the signal lines transfer scan signals, and some of the signal lines are connected to the n-th corner pixel circuit and the (n+1)-th corner pixel circuit.

18. The display apparatus of claim 16, wherein a corner data line which transfers data signals to the corner pixel circuits overlaps the corner pixel circuits and extends in the first direction.

19. The display apparatus of claim 11, wherein the corner display area includes a first corner display area and a second corner display area, the strip portion is in the first corner display area, and a scan driving circuit is in the second corner display area.

20. The display apparatus of claim 19, wherein the corner pixels in the second corner display area at least partially overlap the scan driving circuit.

* * * * *